US012593445B2

(12) United States Patent
Zhang et al.

(10) Patent No.: US 12,593,445 B2
(45) Date of Patent: Mar. 31, 2026

(54) CONTROL GATE STRUCTURES IN THREE-DIMENSIONAL MEMORY DEVICES AND METHODS FOR FORMING THE SAME

(71) Applicant: Yangtze Memory Technologies Co., Ltd., Wuhan (CN)

(72) Inventors: Kun Zhang, Wuhan (CN); Wenxi Zhou, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 817 days.

(21) Appl. No.: 17/861,571

(22) Filed: Jul. 11, 2022

(65) Prior Publication Data

US 2024/0015961 A1     Jan. 11, 2024

(51) Int. Cl.
| | |
|---|---|
| *H10B 41/27* | (2023.01) |
| *H10B 41/10* | (2023.01) |
| *H10B 41/35* | (2023.01) |
| *H10B 43/10* | (2023.01) |
| *H10B 43/27* | (2023.01) |
| *H10B 43/35* | (2023.01) |

(52) U.S. Cl.
CPC ............. *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 41/27; H10B 41/10; H10B 43/35; H10B 41/35; H10B 43/10; H10B 43/27
See application file for complete search history.

(56) References Cited

U.S. PATENT DOCUMENTS

| | | | |
|---|---|---|---|
| 12,052,870 B2 * | 7/2024 | Zhang | ............... H01L 21/31144 |
| 2019/0326312 A1 * | 10/2019 | Zhou | ...................... H10B 43/40 |
| 2024/0145296 A1 * | 5/2024 | Zhou | ................. H01L 21/31144 |

* cited by examiner

*Primary Examiner* — Richard A Booth
(74) *Attorney, Agent, or Firm* — Conley Rose, P.C.

(57) ABSTRACT

A method for forming a three-dimensional memory device can include forming a staircase structure. An alternating layer stack is disposed and etched to form steps. A continuous layer disposed on the staircase structure continuously extends over the steps. An insulating layer is disposed on the continuous layer and a slit is formed extending through the staircase structure. The slit exposes sidewalls of the continuous layer and the steps. The sacrificial layer is removed and a cavity is formed in place of the continuous layer. An etch stop layer is disposed in the cavity and continuously extends over the steps. Openings are formed through the insulating layer and expose a portion of a lateral surface of the etch stop layer. The openings are extended through the etch stop layer to expose a lateral surface of each step of the steps. Contacts are formed in the openings.

15 Claims, 22 Drawing Sheets

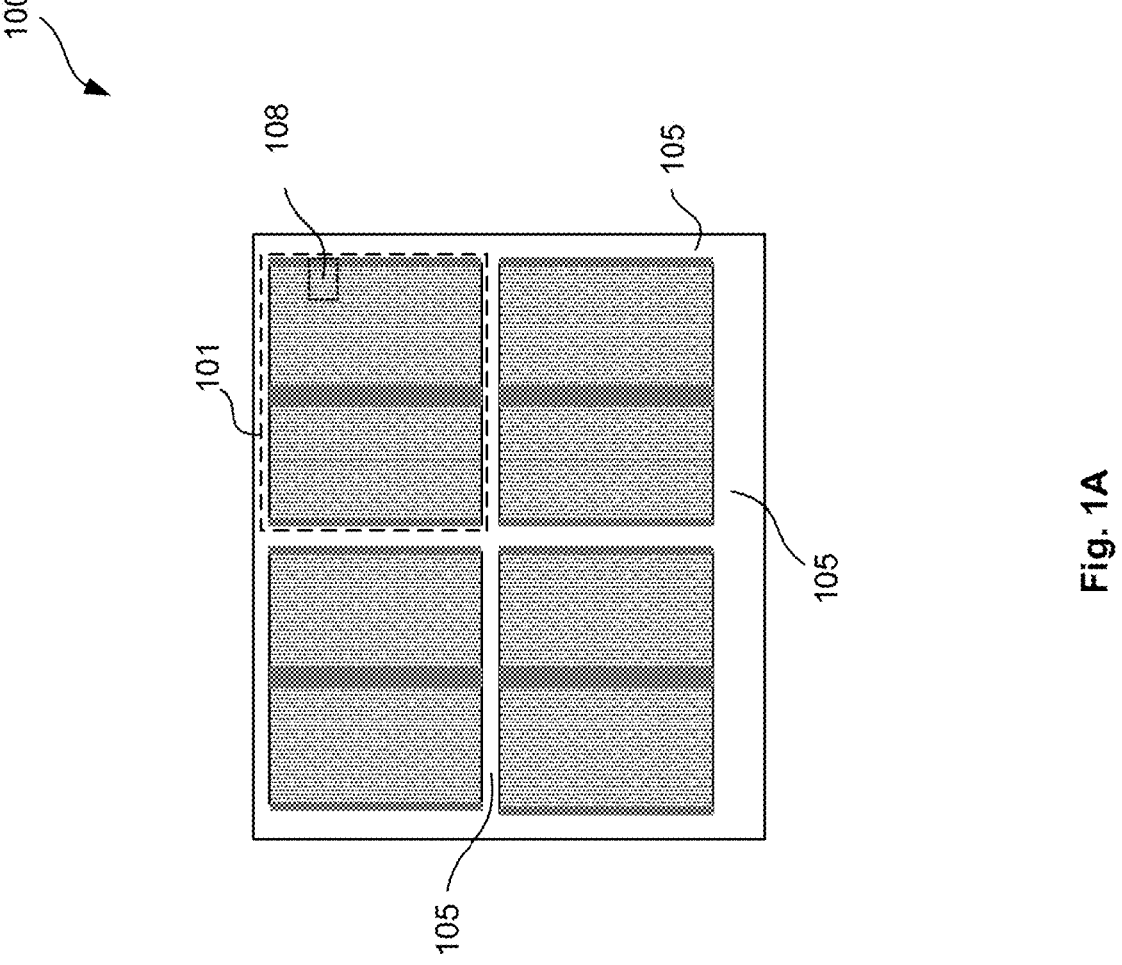
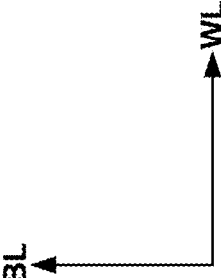
Fig. 1A

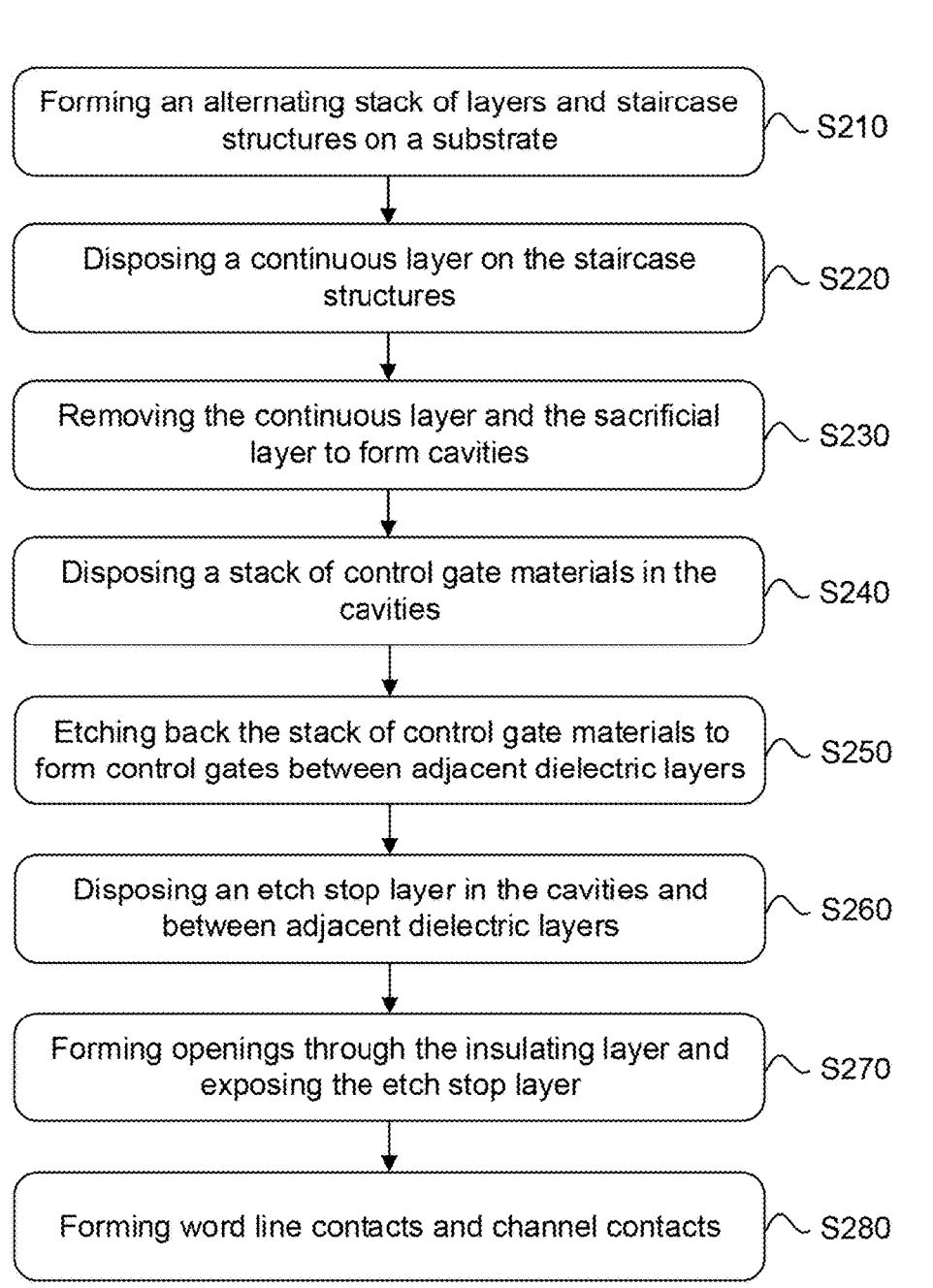

S200

Forming an alternating stack of layers and staircase structures on a substrate  — S210

Disposing a continuous layer on the staircase structures  — S220

Removing the continuous layer and the sacrificial layer to form cavities  — S230

Disposing a stack of control gate materials in the cavities  — S240

Etching back the stack of control gate materials to form control gates between adjacent dielectric layers  — S250

Disposing an etch stop layer in the cavities and between adjacent dielectric layers  — S260

Forming openings through the insulating layer and exposing the etch stop layer  — S270

Forming word line contacts and channel contacts  — S280

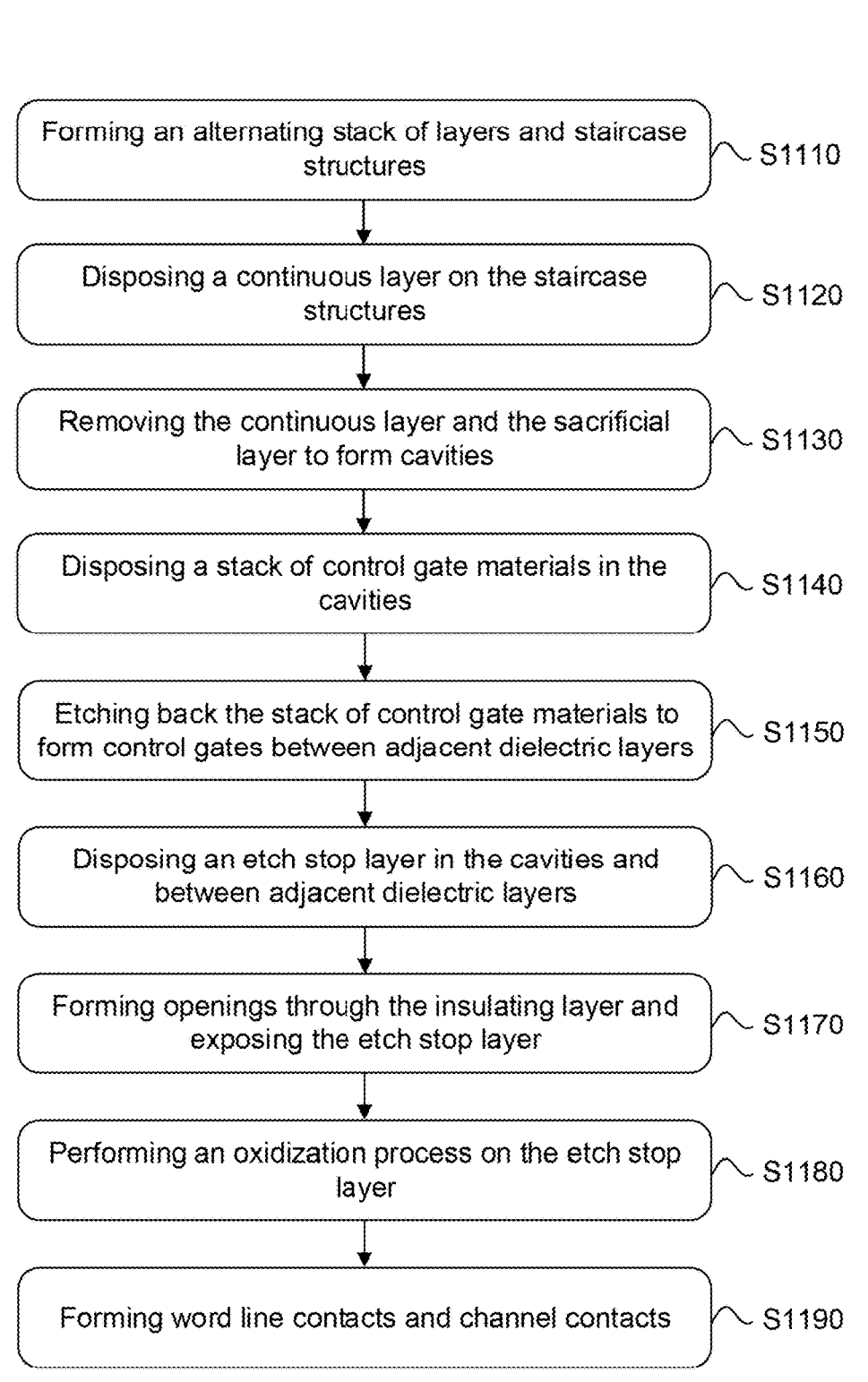

Forming an alternating stack of layers and staircase structures ⟩∼ S1110

Disposing a continuous layer on the staircase structures ⟩∼ S1120

Removing the continuous layer and the sacrificial layer to form cavities ⟩∼ S1130

Disposing a stack of control gate materials in the cavities ⟩∼ S1140

Etching back the stack of control gate materials to form control gates between adjacent dielectric layers ⟩∼ S1150

Disposing an etch stop layer in the cavities and between adjacent dielectric layers ⟩∼ S1160

Forming openings through the insulating layer and exposing the etch stop layer ⟩∼ S1170

Performing an oxidization process on the etch stop layer ⟩∼ S1180

Forming word line contacts and channel contacts ⟩∼ S1190

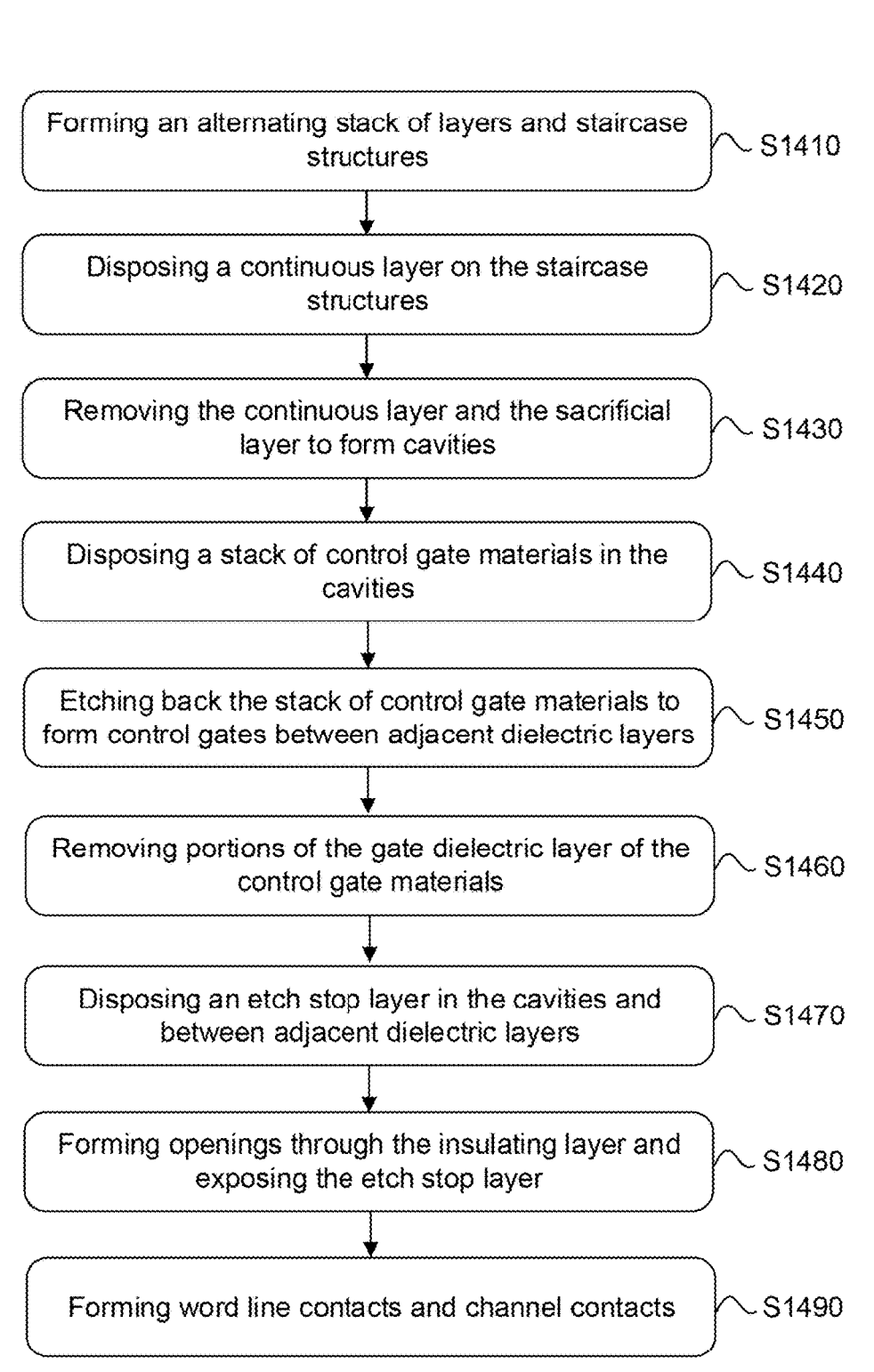

Forming an alternating stack of layers and staircase structures    S1410

Disposing a continuous layer on the staircase structures    S1420

Removing the continuous layer and the sacrificial layer to form cavities    S1430

Disposing a stack of control gate materials in the cavities    S1440

Etching back the stack of control gate materials to form control gates between adjacent dielectric layers    S1450

Removing portions of the gate dielectric layer of the control gate materials    S1460

Disposing an etch stop layer in the cavities and between adjacent dielectric layers    S1470

Forming openings through the insulating layer and exposing the etch stop layer    S1480

Forming word line contacts and channel contacts    S1490

FIG. 14

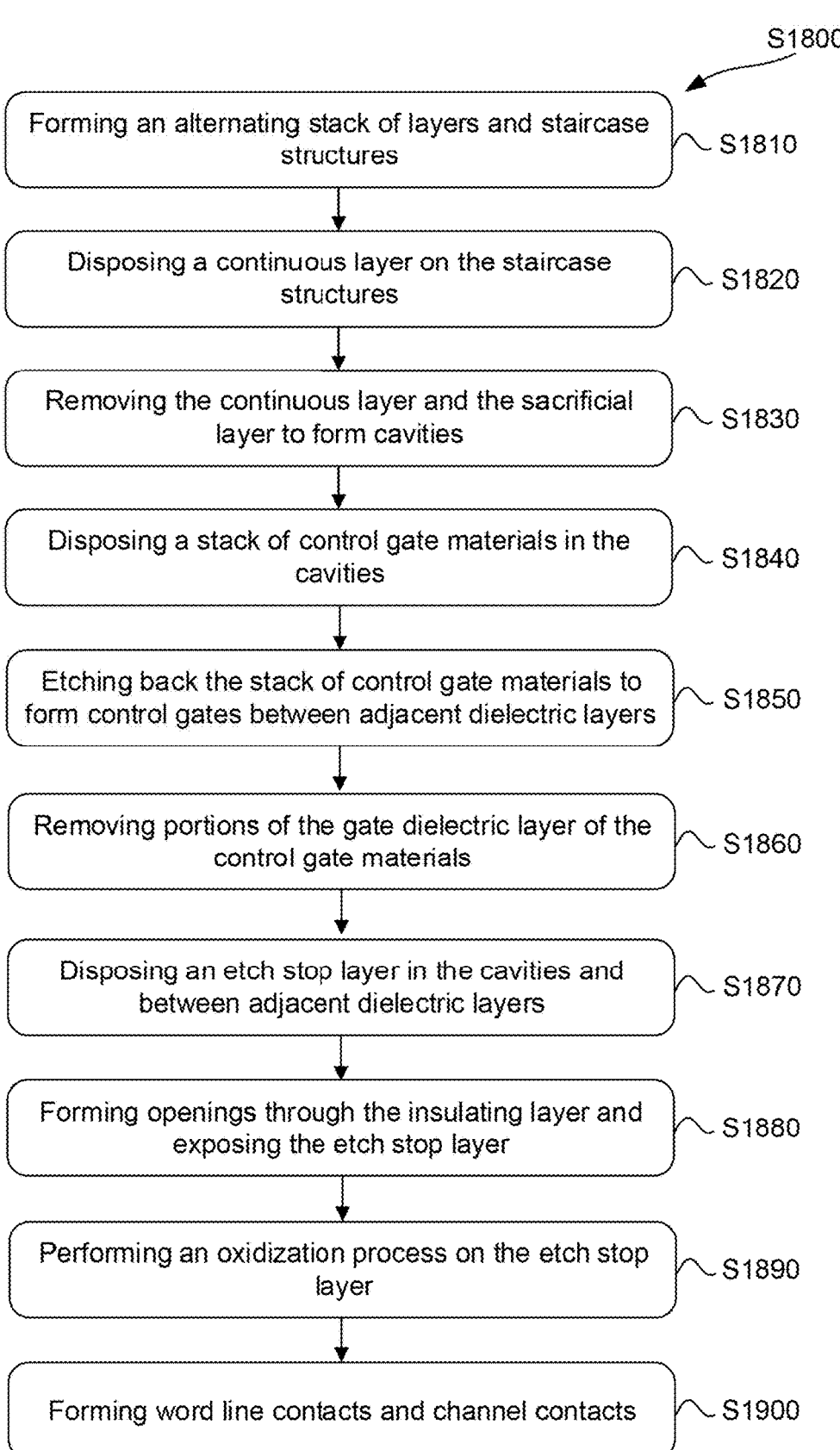

S1800

Forming an alternating stack of layers and staircase structures    S1810

Disposing a continuous layer on the staircase structures    S1820

Removing the continuous layer and the sacrificial layer to form cavities    S1830

Disposing a stack of control gate materials in the cavities    S1840

Etching back the stack of control gate materials to form control gates between adjacent dielectric layers    S1850

Removing portions of the gate dielectric layer of the control gate materials    S1860

Disposing an etch stop layer in the cavities and between adjacent dielectric layers    S1870

Forming openings through the insulating layer and exposing the etch stop layer    S1880

Performing an oxidization process on the etch stop layer    S1890

Forming word line contacts and channel contacts    S1900

CONTROL GATE STRUCTURES IN THREE-DIMENSIONAL MEMORY DEVICES AND METHODS FOR FORMING THE SAME

TECHNICAL FIELD

This present disclosure generally relates to the field of semiconductor technology, and more particularly, to a method for forming a three-dimensional (3D) memory device.

BACKGROUND

Planar memory cells are scaled to smaller sizes by improving process technology, circuit designs, programming algorithms, and fabrication processes. However, as feature sizes of the memory cells approach a lower limit, planar processes and fabrication techniques have become challenging and costly. As such, memory density for planar memory cells approaches an upper limit. A three-dimensional (3D) memory architecture can address the density limitation in planar memory cells.

BRIEF SUMMARY

Embodiments of a three-dimensional (3D) memory device with contact structures and methods for forming the same are described in the present disclosure.

In some embodiments, a method for forming a three-dimensional (3D) memory device can include forming a staircase structure, which can include disposing an alternating layer stack and etching the alternating layer stack to form a plurality of steps. The method can also include disposing a sacrificial layer on the staircase structure. The sacrificial layer continuously extends over the plurality of steps. The method can further include disposing an insulating layer on the sacrificial layer and forming a slit extending through the staircase structure. The slit exposes sidewalls of the sacrificial layer and the plurality of steps. The method can also include removing the sacrificial layer and forming a cavity in place of the sacrificial layer. The method can further include disposing an etch stop layer in the cavity, wherein the etch stop layer continuously extends over the plurality of steps. The method can also include forming a plurality of openings through the insulating layer, wherein each opening of the plurality of openings exposes a portion of a lateral surface of the etch stop layer. The method can further include extending the plurality of openings through the etch stop layer and exposing a lateral surface of each step of the plurality of steps. The method can further include forming a plurality of contacts in the plurality of openings.

In some embodiments, a method for forming a three-dimensional (3D) memory device can include disposing an alternating layer stack on a substrate, which can include disposing a plurality of first dielectric layers and a plurality of second dielectric layers in an alternating manner. The method can also include etching the alternating layer stack to form a staircase structure, wherein the staircase structure comprises a plurality of steps, and wherein each step of the plurality of steps comprises a sidewall surface and a lateral surface. The method can further include disposing a third dielectric layer on the staircase structure, wherein the third dielectric layer continuously contacts sidewall surfaces and lateral surfaces of the plurality of steps. The method can also include disposing an insulating layer on the third dielectric layer and removing the plurality of second dielectric layers to form a plurality of cavities. The method can further include removing the third dielectric layer to form an additional cavity and disposing a gate dielectric layer and one or more conductive layers in each cavity of the plurality of cavities and in the additional cavity. The method can further include removing the one or more conductive layers from the additional cavity and disposing an etch stop layer in the additional cavity. The method can also include forming a plurality of openings through the insulating layer, wherein each opening of the plurality of openings terminates at the etch stop layer. The method can further include etching the etch stop layer through the plurality of openings to expose portions of the one or more conductive layers disposed in the each cavity of the plurality of cavities. The method can further include forming a plurality of contacts on the exposed portions of the one or more conductive layers In some embodiments, a method for forming a three-dimensional (3D) memory device can include disposing an alternating layer stack on a substrate and etching the alternating layer stack to form a staircase structure. The staircase structure can include a plurality of steps, and wherein each step of the plurality of steps comprises a sidewall surface and a lateral surface. The method can also include disposing a dielectric layer on the staircase structure, wherein the dielectric layer continuously contacts the sidewall surfaces and the lateral surfaces of the plurality of steps. The method can further include disposing an insulating layer on the dielectric layer and removing the dielectric layer to form a cavity under the insulating layer. The method can also include disposing an etch stop layer in the cavity and forming a plurality of openings through the insulating layer. Each opening of the plurality of openings terminates at the etch stop layer. The method can further include oxidizing a portion of the etch stop layer through the plurality of openings and etching the portion of the etch stop layer through the plurality of openings and exposing portions of the each step of the plurality of steps. The method can further include forming a plurality of contacts on the portions of the each step of the plurality of steps.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 1A illustrates a schematic top-down view of an exemplary three-dimensional (3D) memory chip, according to some embodiments of the present disclosure.

FIG. 2 illustrates a flow diagram of forming control gate structures in a 3D memory device, according to some embodiments of the present disclosure.

FIG. 11 illustrates a flow diagram of forming control gate structures in a 3D memory device, according to some embodiments of the present disclosure.

FIG. 14 illustrates a flow diagram of forming control gate structures in a 3D memory device, according to some embodiments of the present disclosure.

FIG. 18 illustrates a flow diagram of forming control gate structures in a 3D memory device, according to some embodiments of the present disclosure.

FIGS. 20-22 illustrate schematic cross-sectional views of portions of various 3D memory devices, according to some embodiments of the present disclosure.

Figure 1B:
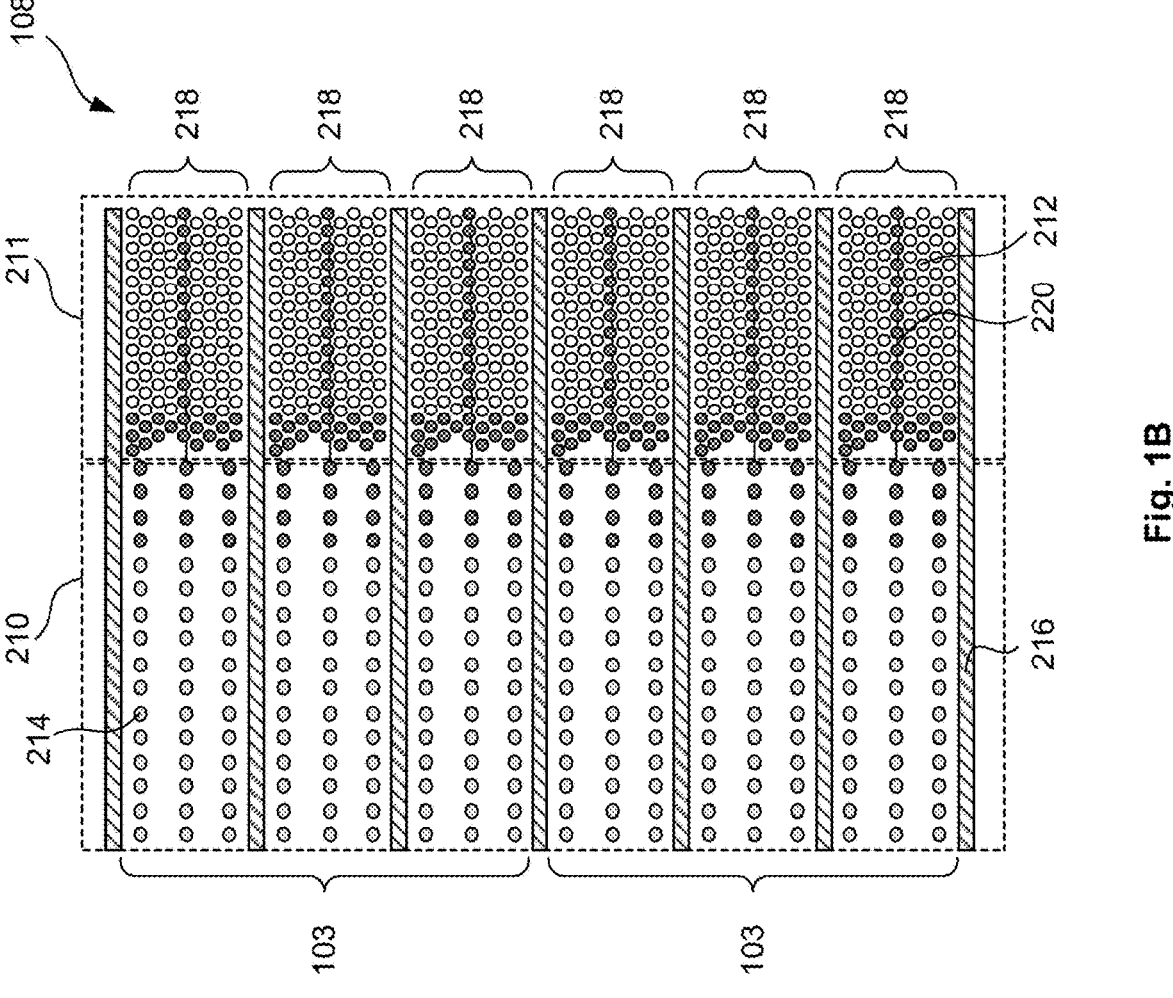
FIG. 1B illustrates a schematic top-down view of a region of a 3D memory chip, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of lateral planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the terms "about" and "substantially" indicate the value of a given quantity that can vary based on a particular technology node associated with the subject semiconductor device. Based on the particular technology node, the term "about" and "substantially" can indicate a value of a given quantity that varies within, for example, 10-30% of the value (e.g., ±10%, ±20%, or ±30% of the value).

In the present disclosure, the term "lateral/laterally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

As the development of 3D memory (e.g., 3D NAND flash memory) progress towards high density and high capacity memory cells, the number of staircase layers in 3D memory devices continues to increase. Each level of the staircase structure can be used as a word line of the 3D memory device. A level of the staircase structure can include a step, such as a portion of the level that is offset from another adjacent level. The step of the staircase structure can be electrically and physically connected to a contact that extends through an insulating layer that covers the staircase structure. As the number of staircase layers increases, aspect ratios of the contacts also increase and can cause etching variation, which can occur between openings formed to expose each step of the staircase structure. Word line contacts can be formed by etching openings through the insulating layer and exposing underlying steps of the staircase structures, followed by deposition processes that fill the openings with one or more conductive materials. Over-etching the exposed steps can lead to a "punch through" of the step and cause shorts between adjacent word lines.

Various embodiments in accordance with the present disclosure provide structures and fabricating methods for forming word line contacts and control gate structures in 3D memory devices. In some embodiments, an alternating layer stack of dielectric layers and sacrificial layers are disposed and etched to form a staircase structure, followed by a deposition process of a continuous dielectric layer on the staircase. An insulating layer is disposed on the staircase structure and on the continuous dielectric layer. The continuous dielectric layer can be removed to form a cavity continuously covering multiple steps of the staircase structure. Conductive materials, such as highly doped polysilicon and metal, can be subsequently disposed in the cavity. In some embodiments, a high-k gate dielectric layer can be removed from the cavity and sidewalls of a slit to reduce stress and wafer bow. In some embodiments, an oxidation process can be performed on the conductive materials to provide electrical isolation between adjacent contacts.

FIGS. 1A and 1B are top-down illustrations of 3D memory device 100, according to some embodiments of the present disclosure. FIG. 1A illustrates a top-down view of an exemplary 3D memory device 100 and FIG. 1B is a top-down enlarged view of a region of 3D memory device 100, according to some embodiments of the present disclosure. 3D memory device 100 can be a memory chip (package), a memory chip or any portion of a memory chip, and can include one or more memory planes 101, each of which can include a plurality of memory blocks. The arrangement of memory planes, memory blocks, and memory fingers illustrated in FIGS. 1A and 1B are only provided as an example, which does not limit the scope of the present disclosure.

As shown in FIG. 1A, exemplary 3D memory device 100 includes four memory planes 101 and each memory plane 101 includes multiple memory blocks. Identical and concurrent operations can take place at each memory plane 101. Memory blocks can be megabytes (MB) in size and can be the smallest size to carry out erase operations. Each memory block can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIGS. 1A and 1B. The memory array is the core area in a memory device, performing storage functions.

In some embodiments as shown in FIG. 1A, 3D memory device 100 can include a periphery region 105, an area surrounding memory planes 101. It is noted that, in some other embodiments not shown in the drawings, the periphery region can be overlap with memory planes in a bonding structure or in a Periphery Under Cell (PUC) structure. Periphery region 105 can contain many digital, analog, and/or mixed-signal circuits (not illustrated in FIG. 1A for simplicity) to support functions of the memory array, for example, page buffers, row and column decoders and sense amplifiers. Peripheral circuits can include active and/or passive semiconductor devices, such as transistors, diodes, capacitors, resistors, and any suitable devices.

Referring to FIG. 1B, a top-down illustration of a region 108 in FIG. 1A is illustrated, according to some embodiments of the present disclosure. Region 108 of 3D memory device 100 can include a staircase region 210 and a channel region 211. In this disclosure, memory block 103 is also referred to as a "memory array" or "array." Channel region 211 can include an array of memory strings 212, each including a plurality of stacked memory cells. Staircase region 210 can include a staircase structure and an array of contact structures 214 formed on the staircase structure. In some embodiments, a plurality of slit structures 216, extending in WL direction across channel region 211 and staircase region 210, can divide a memory block into multiple memory fingers 218. At least some slit structures 216 can function as the common source contact for an array of memory strings 212 in channel regions 211. It is noted that, in some other embodiments not shown in the drawings, the common source contact can be formed on a backside of the array of memory strings, such that the slit structure do not functions as the common source contact. A top select gate cut 220 can be disposed in the middle of each memory finger 218 to divide a top select gate (TSG) of memory finger 218 into two portions, and thereby can divide a memory finger into two programmable (read/write) pages. While erase operation of a 3D NAND memory can be carried out at memory block level, read and write operations can be carried out at memory page level. In some embodiments, region 108 can include dummy memory strings for process variation control during fabrication and/or for additional mechanical support.

FIG. 2 is a flow diagram of an exemplary method S200 for forming word line contact structures and control gate structures in 3D memory devices, in accordance with some embodiments of the present disclosure. The operations of method S200 can be performed in a different order and/or vary, and method S200 can include more operations that are not described for simplicity. FIGS. 3-10 are cross-sectional views of semiconductor structure 300 during various fabrication steps for forming word line contact structures. In some embodiments, semiconductor structure 300 can be a portion of a 3D NAND memory device. The fabrication processes provided here are exemplary, and alternative processes in accordance with this disclosure can be performed that are not shown in these figures.

Figure 3:
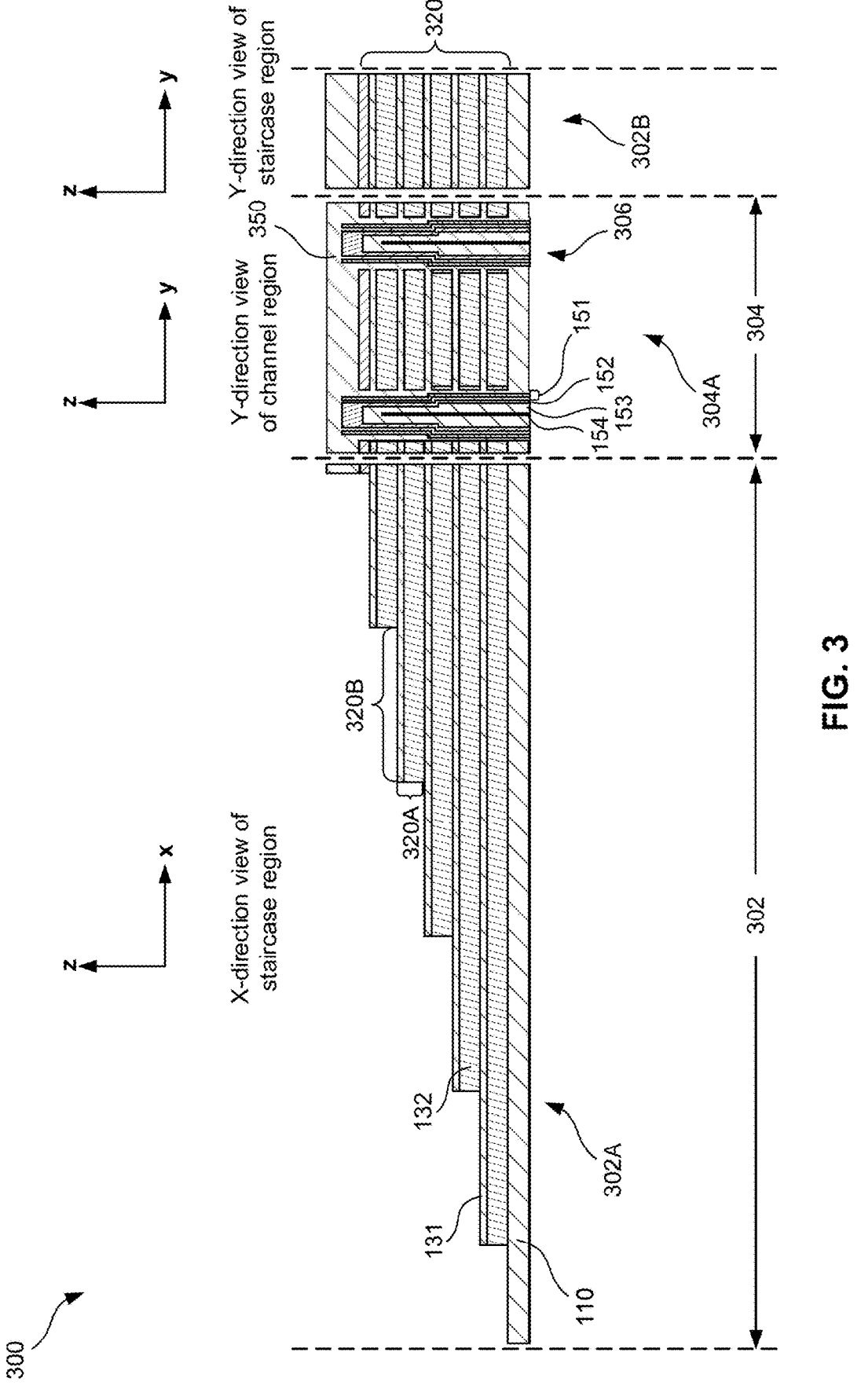
FIGS. 3-10 illustrate schematic cross-sectional views of various fabrication stages of a 3D memory device, according to some embodiments of the present disclosure.

Referring to FIG. 2, at operation S210, an alternating stack of layers and staircase structures are formed on a substrate, according to some embodiments. As shown in FIG. 3, semiconductor structure 300 can include an alternating layer stack 320 disposed on a substrate 110, according to some embodiments. In some embodiments, a dielectric layer 131 and a sacrificial layer 132 can be alternatingly disposed on the substrate. For ease of description, semiconductor structure 300 can be divided into a staircase region 302 and a channel region 304. FIGS. 3-10 illustrate an x-direction view 302A and also a y-direction view 302B of staircase region 302. FIGS. 3-10 also illustrate a y-direction view 304A of channel region 304.

Substrate 110 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some embodiments, substrate 110 can be double-side polished prior to device fabrication. Substrate 110 can be a multi-layer structure including one or more suitable sub-layers. For example, substrate 110 can include a base formed using silicon and an oxide layer formed of silicon oxide.

Alternating layer stack 320 can include multiple dielectric layer pairs formed by disposing first and second dielectric layers in an alternating manner. For example, alternating layer stack 320 can be formed by repeatedly disposing a dielectric layer 131 and a sacrificial layer 132 in turn. For the ease of description, a dielectric layer 131 and a sacrificial layer 132 can form a dielectric layer pair. In some embodiments, dielectric layers 131 can be formed using a silicon oxide material. In some embodiments, sacrificial layers 132 can be formed using a silicon nitride material. Dielectric layers 131 and sacrificial layers 132 can be disposed using one or more thin-layer deposition processes including, but not limited to, chemical vapor deposition (CVD), plasma-enhanced CVD (PECVD), physical vapor deposition (PVD), atomic layer deposition (ALD), plasma-enhanced ALD (PEALD), or any combinations thereof. In some embodiments, thicknesses of dielectric layers 131 can be the same or different. Similarly, thicknesses of sacrificial layers 132 can be the same or different. In some embodiments, an optional oxide layer 350 can be formed on the top-most step of alternating layer stack 320.

Alternating layer stack 320 can be processed to form staircase structures, according to some embodiments. The staircase structures can be formed using a "trim-etch" multi-cycle process. Specifically, a masking layer (e.g., photoresist layer) can disposed on alternating layer stack 320 and patterned using suitable photolithography process. The "trim-etch" multi-cycle process can form multiple staircase divisions in alternating layer stack 320 and can also form steps of staircase structures with different depths. The "trim-etch" multi-cycle process can include trimming the masking layer and etching a part of alternating layer stack 320 uncovered by the masking layer. The part of alternating layer stack 320 uncovered by the masking layer can be etched by a stair depth. The masking layer can be trimmed to further expose portions of alternating layer stack 320. The cycles of trimming and etching can be repeated for a number of times based on the number of staircase divisions. In some embodiments, the masking layer is trimmed in two lateral directions, such as a first direction along the word line and a second direction along a bit line. After the staircase is formed, each pair of dielectric layer 131 and sacrificial layer 132 can be considered as a level of the staircase structure. In some embodiments, alternating layer stack 320 can include any suitable amount of levels, such as 32 levels, 64 levels, 128 levels, etc. Portions of a top surface of a level not covered by another level can be considered a top surface of a step or a "contact landing" on which a word line contact can be formed. In other words, a step of a level can be referred to as a portion of the level not covered by another level formed immediately above the level. For example, level 320A includes a step 320B, as shown in FIG. 3. Step 320B can include a lateral top surface and sidewall surfaces. FIG. 3 also illustrates five levels of the staircase structure and other levels are omitted for simplicity.

Channel structures can be formed in channel region 304. For example, channels 306 can be formed in channel region 304 and extend through alternating layer stack 320. Channels 306 also include a channel layer 152 surrounded by function layer 151. In some embodiments, function layer 151 contains a tunneling layer, a charge storage layer, and a blocking layer, arranged along a direction from the center of each channel layer 152 toward alternating layer stack 320, according to some embodiments. In some embodiments, a channel filing structure 153 can be surrounded by channel layer 152. In some embodiments, an air gap 154 can be embedded in channel layer 152 to reduce stress within channel 306.

Figure 4:
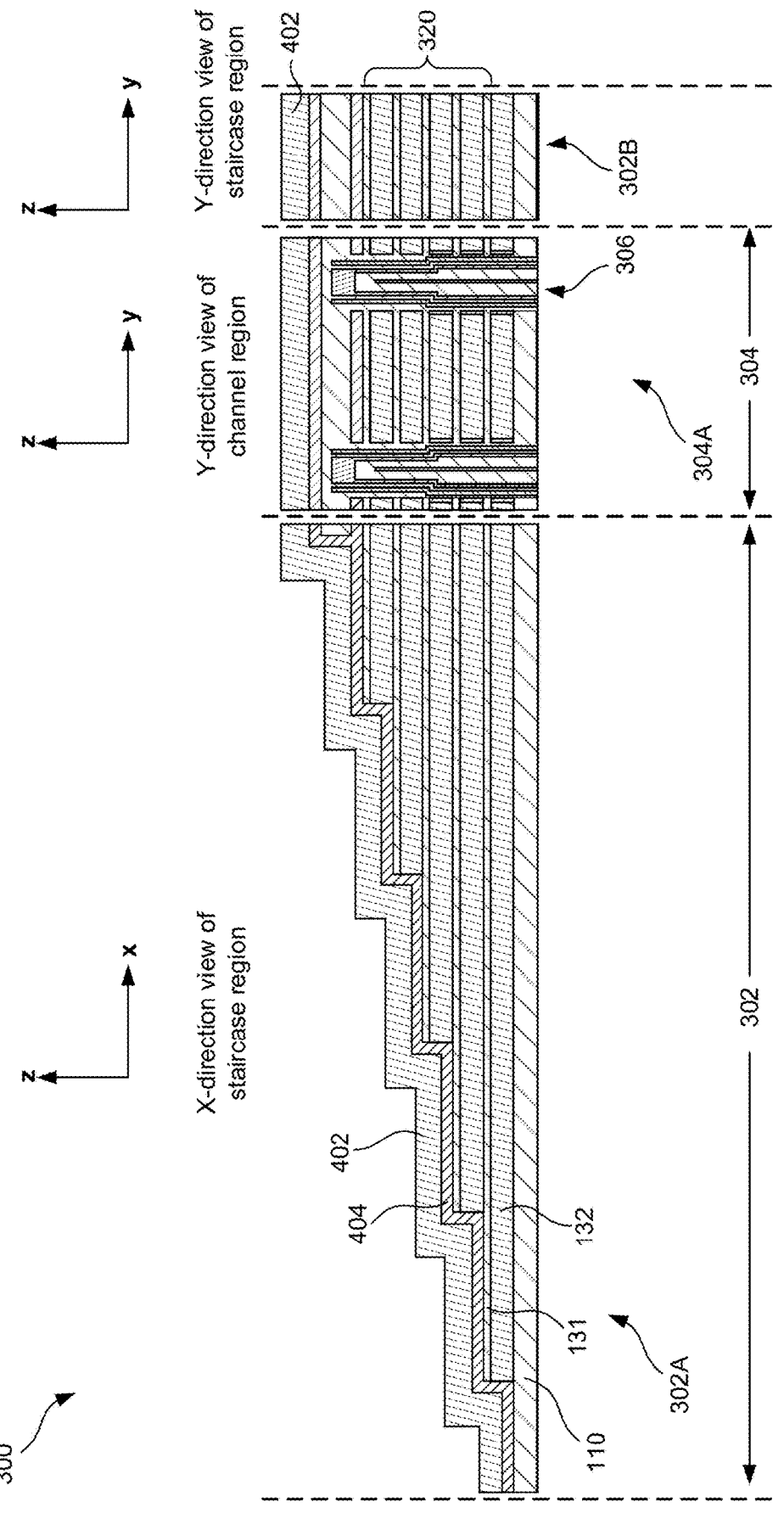

Referring to FIG. 2, at operation S220, a continuous layer is continuously disposed on the staircase structures, according to some embodiments. In some embodiments, the continuous layer is removed in subsequent fabrication steps and the continuous layer can also be referred to as a sacrificial layer. As shown in FIG. 4, a continuous layer 402 can be disposed on alternating layer stack 320. For example, continuous layer 402 continuously covers top and sidewall surfaces of at least multiple steps of alternating layer stack 320. FIG. 4 illustrates continuous layer 402 extends from above a top surface of the top-most step to a top surface of the bottom-most step of alternating layer stack 320 without breaks or gaps in the layer structure. In some embodiments, continuous layer 402 substantially contours the sidewalls and the lateral surfaces of the steps of alternating layer stack 320. In some embodiments, continuous layer 402 can cover other suitable steps of the staircase structure of alternating layer stack 320. For example, suitable continuous layer 402 can continuously extend from being over a second top-most step or a third top-most step to being over any suitable lower steps. In some embodiments, continuous layer 402 can be formed using a dielectric material, such as a silicon nitride material. In some embodiments, continuous layer 402 can have a substantially uniform thickness. For example, continuous layer 402 can have a substantially uniform thickness between about 5 nm and about 5000 nm. In some embodiments, a liner layer 404 can be disposed on alternating layer stack 320 before continuous layer 402 is disposed and used for increasing the break down voltage. In some embodiments, a liner layer 404 can be formed using a dielectric material different from that of continuous layer 402. For example, liner layer 404 can be formed using a silicon oxide material. In some embodiments, liner layer 404 is optional and continuous layer 402 can be disposed directly on steps of the levels of alternating layer stack 320. In such arrangement, continuous layer 402 can directly contact lateral surfaces and sidewall surfaces of the steps of alternating layer stack 320.

Figure 5:
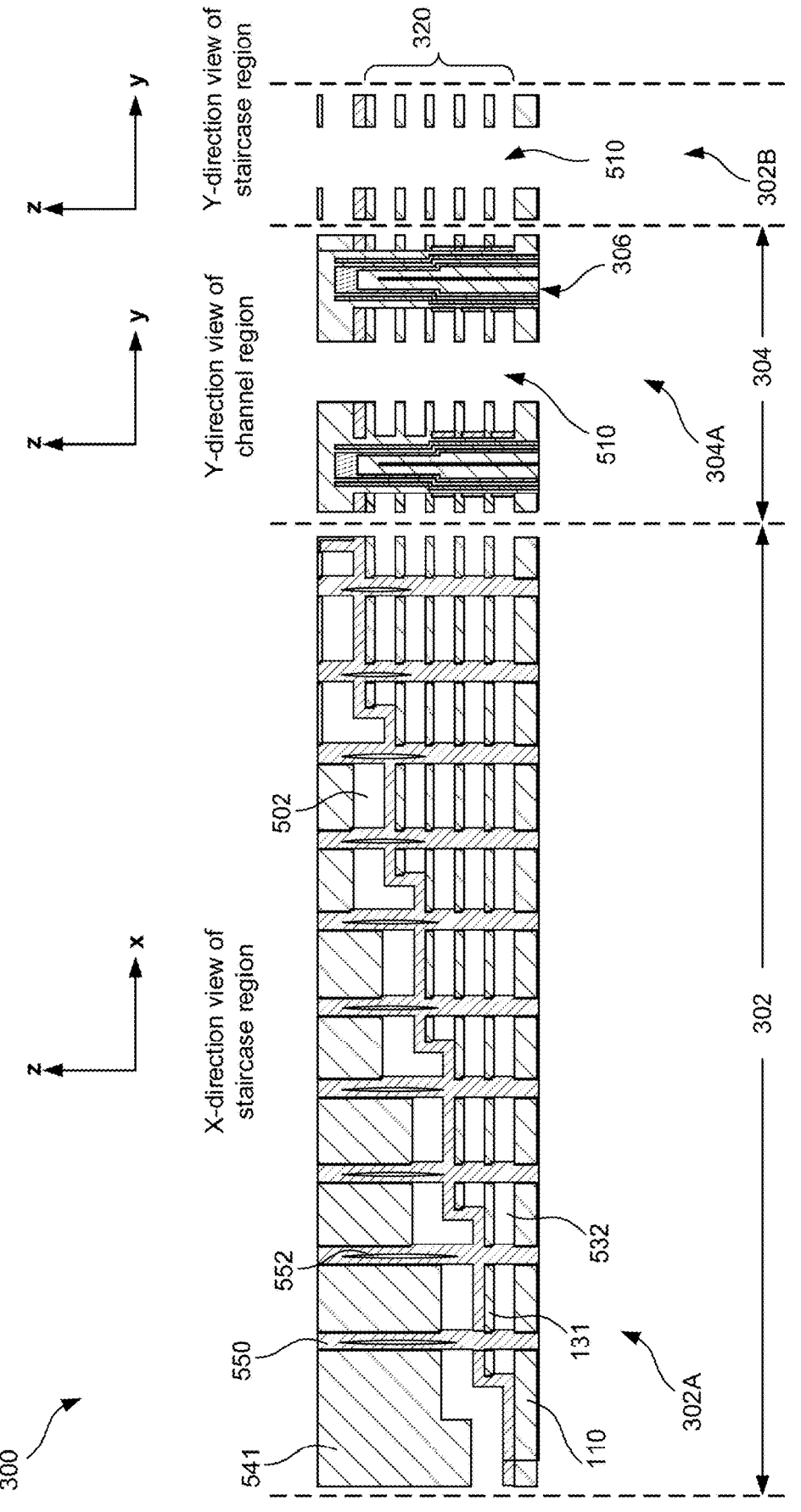

Referring to FIG. 2, at operation S230, the continuous layer and the sacrificial layer are removed to form cavities, according to some embodiments. Referring to FIG. 5, continuous layer 402 and sacrificial layer 132 are removed, forming cavities in place of the aforementioned removed layers. In some embodiments, continuous layer 402 and sacrificial layer 132 can have a same material, and can be removed by a single etching process. In some other embodiments, continuous layer 402 and sacrificial layer 132 can have different materials, and can be removed by two different etching processes respectively.

In some embodiments, prior to the removal of continuous layer 402 and sacrificial layer 132, an insulating layer 541 can be disposed on continuous layer 402 in staircase region 302 and channel region 304. Insulating layer 541 can be formed on the staircase structure of alternating layer stack 320. In some embodiments, insulating layer 541 can be formed of a dielectric material similar to that of dielectric layer 131. For example, insulating layer 541 can be formed of a silicon oxide material. Insulating layer 541 can be formed using suitable deposition methods, such as CVD, PVD, PECVD, ALD, any suitable deposition methods, or any combinations thereof.

Dummy channels 550 can also be formed through alternating layer stack 320. In some embodiments, structures and compositions of dummy channel 550 can be similar to channels 306, except that top portions of dummy channels 550 may not contain channel contact structures for connecting to conductive lines. In some embodiments, dummy channels 550 can be filled with insulating materials. Air gaps 552 can also be formed in dummy channels 550 to reduce stress within dummy channels 550. Dummy channels 550 can be formed by forming openings through alternating layer stack 320 and dispose one or more layers in the openings using CVD, PVD, ALD, suitable deposition methods, or combinations thereof.

An opening 510 extends through alternating layer stack 320 and can be formed after insulating layer 541 is disposed. Opening 510 is shown in the y-direction view 304A of channel region 304 and extends through staircase region 302 and channel region 304. Opening 510 can be a slit formed by suitable patterning and etching processes on alternating layer stack 320. Opening 510 exposes sidewalls of continuous layer 402 and sacrificial layers 132, and the removal process of continuous layer 402 and sacrificial layers 132 can begin from the exposed sidewalls until continuous layer 402 and sacrificial layers 132 are removed. For example, a wet chemical etching process configured to etch silicon nitride material can be used to etch continuous layer 402 and sacrificial layers 132 through opening 510, and the etching process can continue until continuous layer 402 and sacrificial layers 132 are removed. A continuous cavity 502 and multiple cavities 532 can be formed in place of continuous layer 402 and sacrificial layers 132, respectively.

Figure 6:
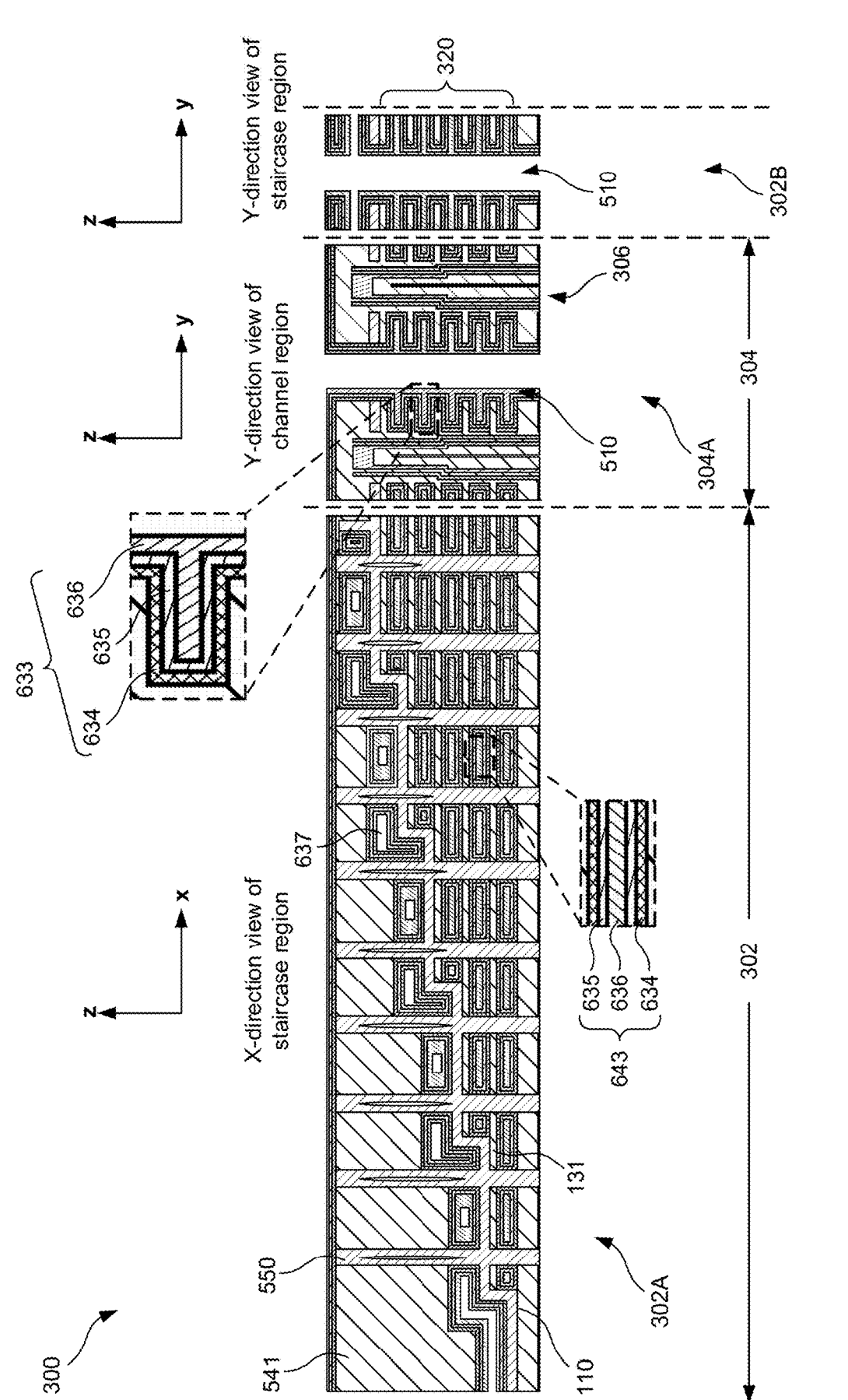

Referring to FIG. 2, at operation S240, a stack of control gate materials are disposed in the cavities, according to some embodiments. Referring to FIG. 6, a stack of control gate materials 633, including dielectric layer 634, first conductive layer 635, and second conductive layer 636, is deposited in cavities 502 and 532 of FIG. 5 in both staircase region 302 and channel region 304. In some embodiments, the stack of control gate materials 633 fills cavity 532 formed in each step of alternating layer stack 320, such as the opening between adjacent dielectric layers 131. For the ease of description, the stack of control gate materials 633 formed in cavities 532 of staircase region 302 can be referred to as word line 643. In some embodiments as shown in FIG. 6, the stack of control gate materials 633 partially fills cavity 502, forming cavity 637 surrounded by the stack of control gate materials 633. It is noted that, on one or more steps (not shown in the drawings), the stack of control gate materials 633 may fully fill cavity 502 without forming cavity 637. In some embodiments, dielectric layer 634 can be a gate dielectric layer and formed using a high-K dielectric material (e.g., a dielectric material having dielectric constant greater than about 3.9). In some embodiments, dielectric layer 634 can be formed using aluminum oxide, hafnium oxide, any suitable oxide material, or combinations thereof. First conductive layer 635 can be formed using titanium aluminum nitride, titanium nitride, any suitable conductive nitride material, or combinations thereof. Second conductive layer 636 can be formed using tungsten, cobalt, copper, aluminum, doped crystalline silicon, any suitable conductive material, or combinations thereof. In some embodiments, dielectric layer 634, first conductive layer 635, and second conductive layer 636 can be formed using CVD, PVD, PECVD, ALD, any suitable deposition processes, or combinations thereof. In some embodiments, the stack of control gate materials 633, including dielectric layer 634, first conductive layer 635, and second conductive layer 636, can also be disposed on top surfaces of semiconductor structure 300. For example, the stack of control gate materials 633 can also be disposed on the top surfaces of insulating layer 541 and dummy channel 550. In some embodiments, the stack of control gate materials 633 can also be formed on sidewalls of opening 510.

Figure 7:
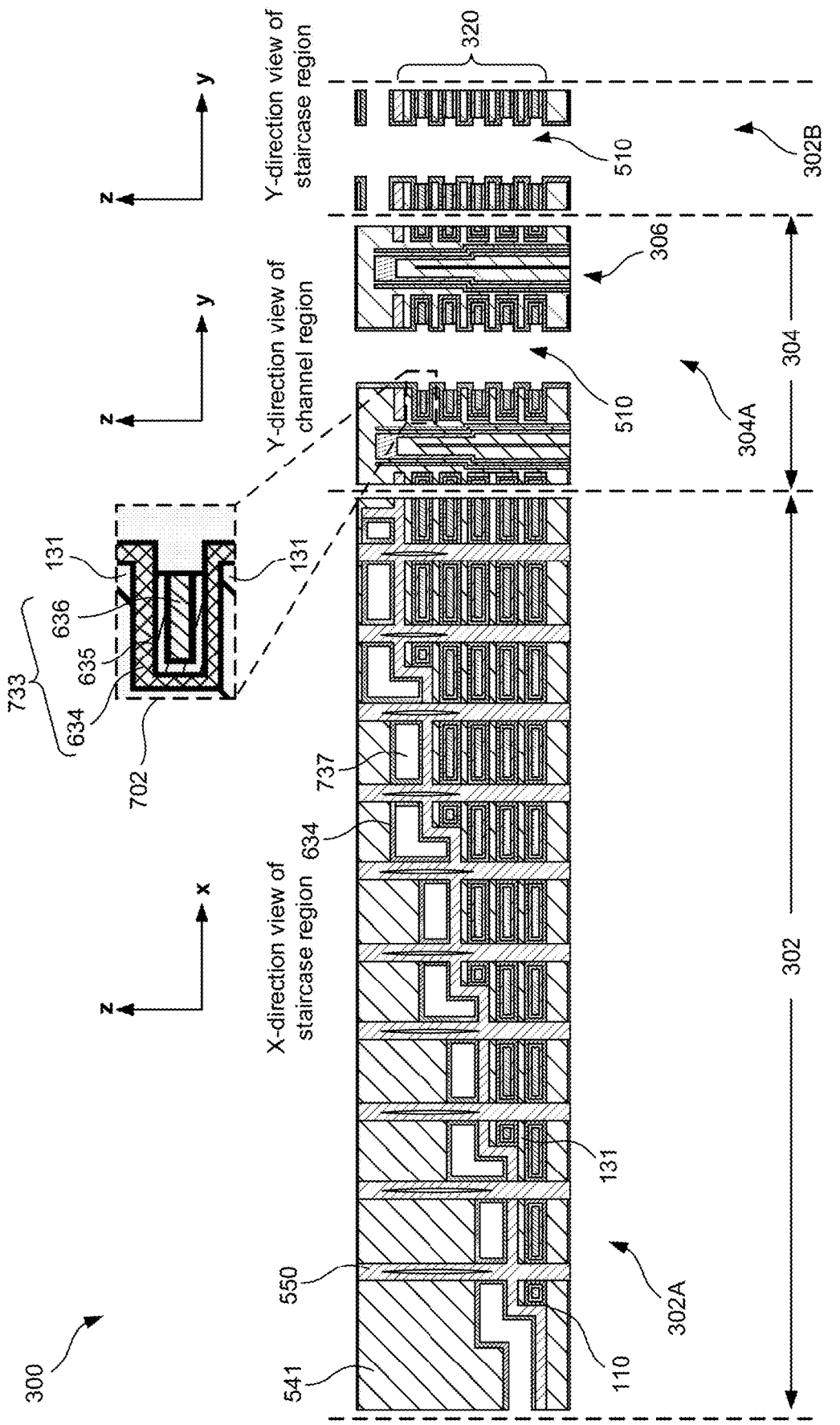

Referring to FIG. 2, at operation S250, the stack of control gate materials is etched back to form control gates between adjacent dielectric layers, according to some embodiments. Referring to FIG. 7, portions of the stack of control gate materials 633 illustrated in FIG. 6 are etched back to form control gate 733 including portions of first conductive layer 635 and second conductive layer 636 formed between adjacent dielectric layers 131. As shown in enlarged view 702, remaining portions of first conductive layer 635 and second conductive layer 636 are laterally recessed and formed between adjacent dielectric layers 131. In some embodiments, dielectric layer 634 remains on surfaces of dielectric layers 131, including lateral surfaces and sidewall surfaces of dielectric layers 131. Therefore, dielectric layer 634 remains between dielectric layers 131 and first and second conductive layers 635 and 636. In some embodiments, first conductive layer 635 and second conductive layer 636 are removed from the stack of control gate materials 633 formed in cavity 502 as illustrated in FIGS. 5 and 6, forming a cavity 737 surrounded by dielectric layer 634. In some embodiments, first conductive layer 635 and second conductive layer 636 can be removed using suitable wet chemical etching processes or dry plasma etching processes. For example, one or more wet chemical etching processes for removing tungsten and titanium nitride materials can be used.

Figure 8:
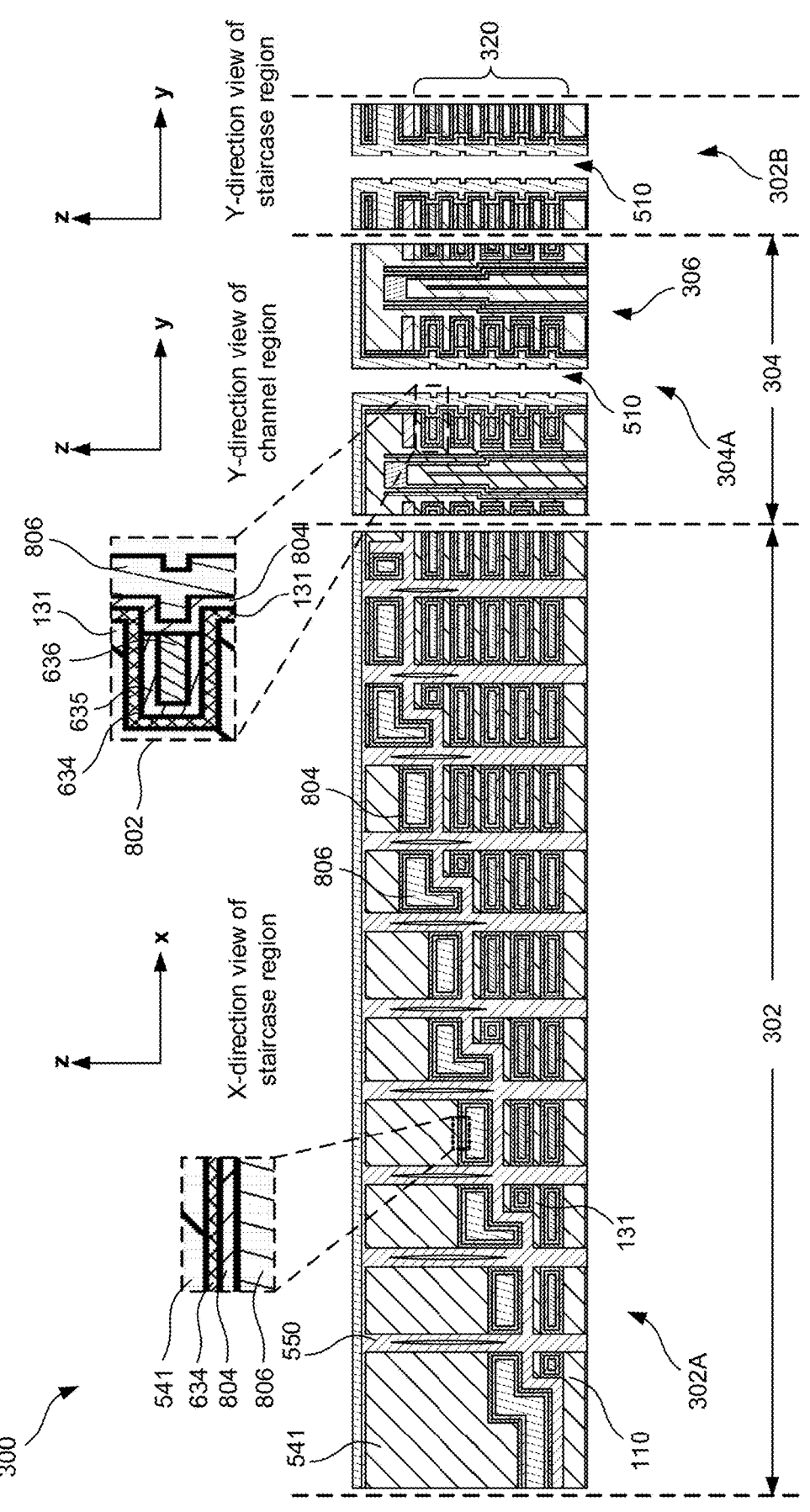

Referring to FIG. 2, at operation S260, an etch stop layer is disposed in the cavity and between adjacent dielectric layers, according to some embodiments. Referring to FIG. 8, an etch stop layer 806 is disposed on exposed surfaces of semiconductor structure 300. In some embodiments, etch stop layer 806 is disposed in cavity 737 illustrated in FIG. 7. For example, etch stop layer 806 fills cavity 737 and is surrounded by dielectric layer 634. In some embodiments, etch stop layer 806 can partially fill cavity 737. In some embodiments, an optional liner layer 804 can be disposed prior to the deposition of etch stop layer 806. As shown in enlarged view 802, liner layer 804 directly contacts sidewall surfaces of first conductive layer 635 and second conductive layer 636, as well as surfaces of dielectric layer 634. Portions of liner layer 804 and etch stop layer 806 can be formed between adjacent dielectric layers 131. It is noted that, one or more voids (not shown) can be formed within etch stop layer 806. In some embodiments, etch stop layer 806 can be formed using a metal or metal alloy, such as tungsten and tungsten silicide. In some embodiments, any suitable metal silicides can be used to form etch stop layer 806. In some embodiments, etch stop layer 806 can be formed using silicon nitride material. In some embodiments, etch stop layer 806 can also be formed using highly doped polycrystalline silicon material. In some embodiments, etch stop layer 806 can also be formed using any suitable MxSiy material (M is any suitable metal, x and y are any suitable integer numbers) or combinations of various MxSiy materials. In some embodiments, etch stop layer 806 can be disposed using ALD, CVD, PVD, PECVD, any suitable deposition methods, and/or combinations thereof. In some embodiments, an optional planarization process can be performed to remove portions of etch stop layer 806.

Figure 9:
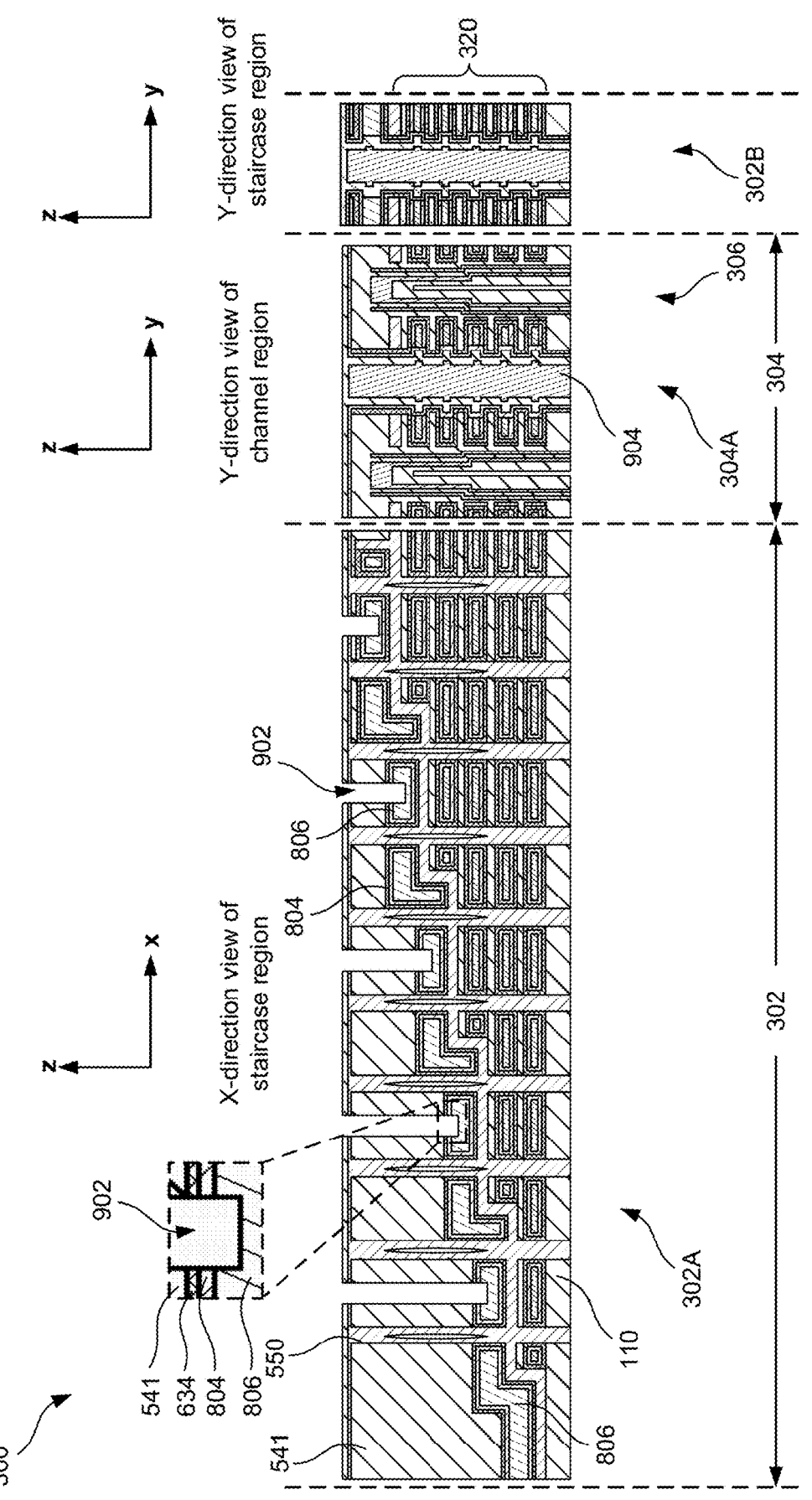

Referring to FIG. 2, at operation S270, openings are formed through the insulating layer and the etch stop layer is exposed, according to some embodiments. Referring to FIG. 9, openings 902 can be formed by patterning and etching insulating layer 541 to expose a lateral surface of the underlying dielectric layer 634. The etching process continues to remove portions of the exposed dielectric layer 634 and liner layer 804. In some embodiments, the etching process for forming openings 902 continues until a lateral surface of etch stop layer 806 is exposed. In some embodiments, the etching process for forming openings 902 further continues until etch stop layer 806 is recessed by the etching process, as shown in FIG. 9. In some embodiments, etch stop layer 806 is partially etched without being etched through. In other words, openings 902 terminates at etch stop layer 806. In some embodiments, openings 902 are formed between adjacent dummy channels 550. In some embodiments, prior to the formation of openings 902, a slit filling structure 904 can be disposed in opening 510. The formation process of slit filling structure 904 can begin with disposing a filler material on etch stop layer 806 in opening 510 until the filler material fills opening 510. In some embodiments, slit filling structure 904 can be formed using metal, metal alloy, insulating materials, semiconductor materials, any suitable material, or combinations thereof. In some embodiments, a CMP process can be performed after the filler material fills opening 510. The etching processes for forming openings 902 can be wet chemical etching processes, dry plasma etching processes, any suitable etching processes, or combinations thereof.

Figure 10:
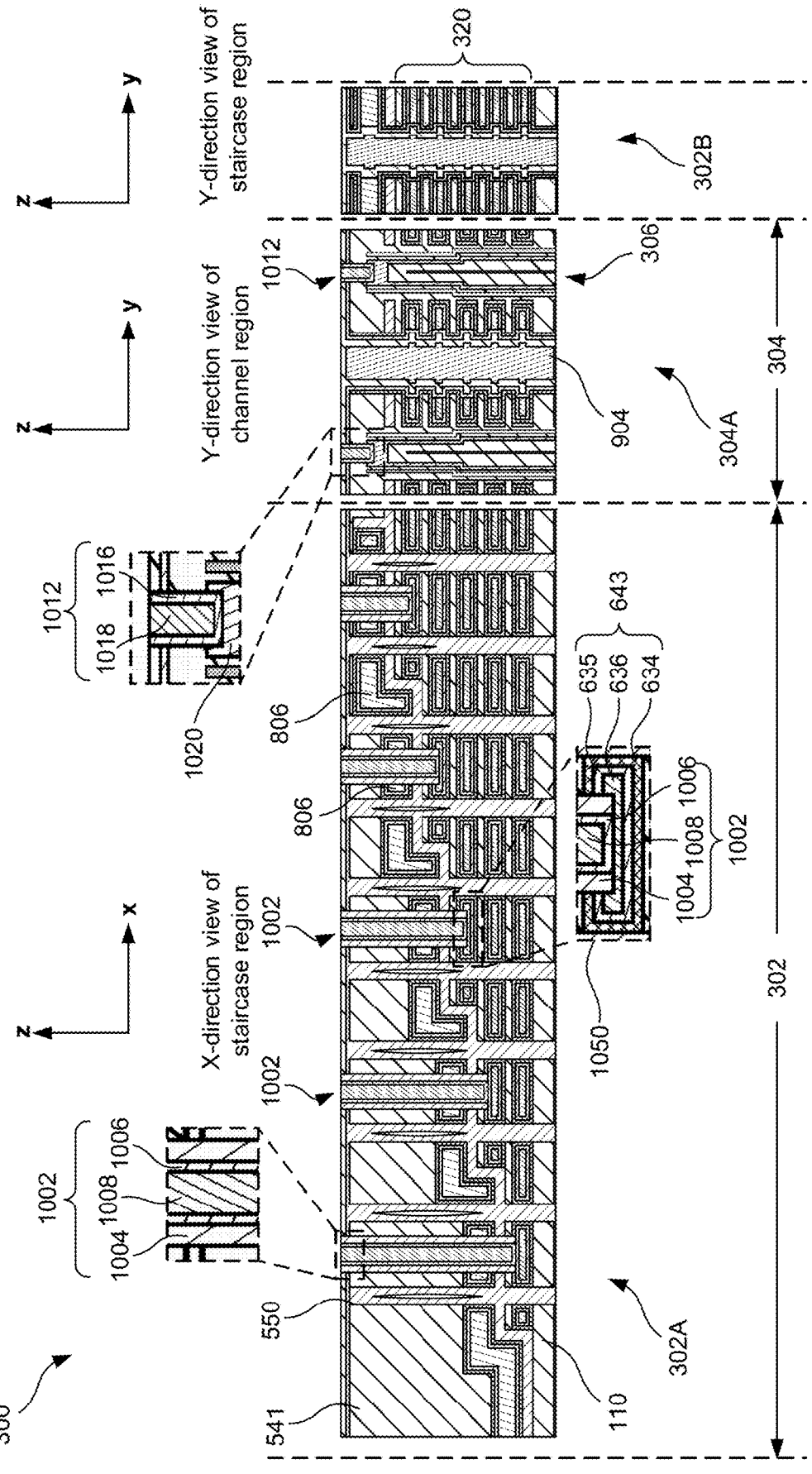

Referring to FIG. 2, at operation S280, word line contacts and channel contacts are formed, according to some embodiments. Referring to FIG. 10, word line contacts 1002 and channel contacts 1012 are respectively formed in staircase region 302 and channel 306. Word line contacts 1002 and channel contacts 1012 provide electrical connections to word lines 643 and channels 306.

Word line contacts 1002 can include spacers 1004, liner layer 1006, and conductive material 1008. In some embodiments, one contact structure, such as word line contact 1002, is formed in opening 902. In some embodiments, spacers 1004 can be formed by extending openings 902 through etch stop layer 806 and into each step of alternating layer stack 320. A dielectric material can be uniformly disposed on sidewall surfaces and bottom surfaces of extended openings 902, followed by an anisotropic etching process that substantially removes dielectric material in the vertical direction (e.g., z direction). As a result, the dielectric material can remain on the sidewalls of extended openings 902 and form spacers 1004. In some embodiments, spacers 1004 can be formed of any suitable dielectric materials, such as silicon oxide, silicon nitride, silicon oxycarbide, silicon oxynitride, or combinations thereof. In some embodiments, spacers 1004 can be formed of silicon oxide and formed by a wet oxidization process. In some embodiments, openings 902 can be extended into second conductive layer 636 of word line 643, such that spacers 1004 can be in contact with dielectric layer 634, first conductive layer 635, and second conductive layer 636, as shown in enlarged view 1050 of FIG. 10.

Liner layer 1006 can be disposed after spacers 1004 are formed. In some embodiments, liner layer 1006 can be uniformly disposed on sidewalls of spacers 1004 and a top surface of exposed second conductive layer 636, as shown in enlarged view 1050. In some embodiments, liner layer 1006 can include any suitable liner material, such as tantalum (Ta), TaN, titanium (Ti), TiN, and WN. In some embodiments, liner layer 1006 can be a thin layer of silver metal alloy comprising silver and a second material, such as lanthanum (La), titanium (Ti), tungsten (W), zirconium (Zr), antimony (Sb), or calcium (Ca)), and optionally a third component, such as nitrogen (N), phosphorous (P), carbon (C), sulfur (S), silicon (Si), germanium (Ge), aluminum (Al), or boron (B). In some embodiments, although not illustrated in FIG. 10, an anisotropic etching process can remove portions of liner layer 1006 from the top surface of exposed second conductive layer 636 such that subsequently disposed conductive material 1008 can be in contact with second conductive layer 636. In some embodiments, liner layer 1006 is optional and can be formed using a different dielectric material than spacers 1004. Conductive material 1008 is disposed between spacers 1004 and in contact with liner layer 1006. In some embodiments, conductive material 1008 can be formed of any suitable conductive materials, such as tungsten, cobalt, copper, aluminum, silicides, or any combinations thereof. Spacers 1004, liner layer 1006, and conductive material 1008 can be disposed using suitable deposition methods, such as ALD, CVD, PECVD, PVD, or combinations thereof.

Channel contacts 1012 can include liner layer 1016 and conductive material 1018. Each channel contact 1012 can extend through insulating layer 541 and in contact with a top portion of channel 306. In some embodiments, channel contacts 1012 is in physical and electrical contact with a capping layer 1020 of channel 306.

Figure 12:
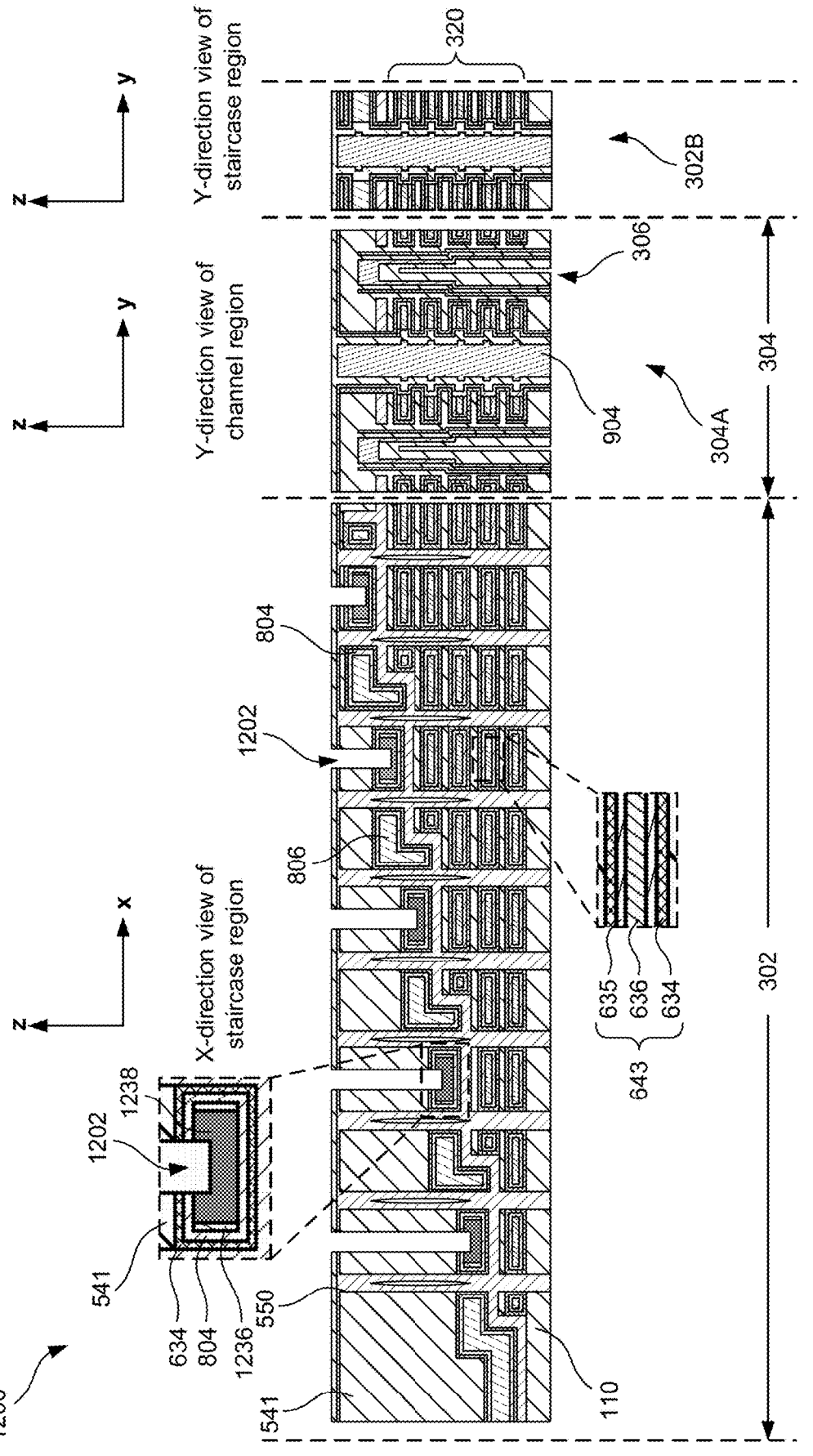
FIGS. 12 and 13 illustrate schematic cross-sectional views of various fabrication stages of a 3D memory device, according to some embodiments of the present disclosure.
Figure 13:
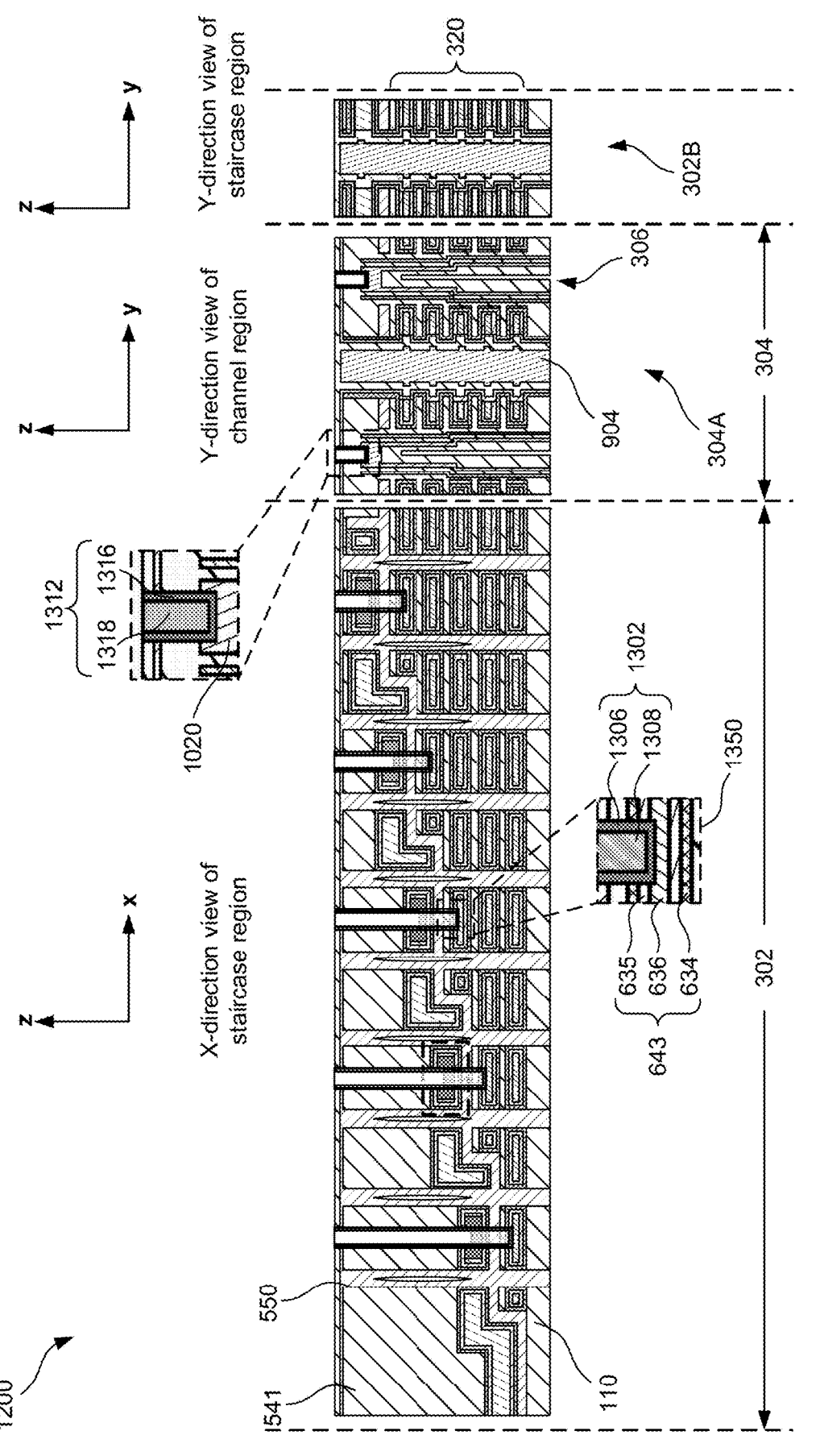

FIG. 11 is a flow diagram of an exemplary method S1100 for forming word line contact structures and control gate structures in 3D memory devices, in accordance with some embodiments of the present disclosure. The operations of method S1100 can be performed in a different order and/or vary, and method S1100 can include more operations that are not described for simplicity. FIGS. 12 and 13 are cross-sectional views of semiconductor structure 1200 during various fabrication steps for forming word line contact structures. In some embodiments, semiconductor structure 1200 can be a portion of a 3D NAND memory device. The fabrication processes provided here are exemplary, and alternative processes in accordance with this disclosure can be performed that are not shown in these figures. In some embodiments, operations S1110-S1170 can be respectively similar to operations S210-S270 of operation S200, and are not described in detail herein for simplicity. Elements illustrated in FIGS. 12 and 13 that have similar reference numbers as elements illustrated in FIGS. 3-10 generally indicate identical, functionally similar, and/or structurally similar elements.

Referring to FIG. 11, at operation S1180, an oxidization process is performed on the etch stop layer, according to some embodiments. As shown in FIG. 12, openings 1202 can be formed in staircase region 302 through insulating layer 541, dielectric layer 634, and liner layer 804. Similar to openings 902 of FIG. 9, openings 1202 can also expose a portion of the etch stop layer such as etch stop layer 806, and an oxidization process can be performed through openings 1202 on the exposed portion of etch stop layer 806. Portions of etch stop layer 806 that are not exposed remain unoxidized because those portions are not directly exposed through openings 1202. The oxidization process can convert portions of etch stop layer 806 into an oxide material, such as an oxide material 1238. In some embodiments, the oxidization process converts a portion rather than the entirety of etch stop layer 806. A remaining portion of etch stop layer 806, such as remaining etch stop layer 1236, is formed between oxide material 1238 and liner layer 804. In some embodiments, etch stop layer 806 can be formed of tungsten and oxide material 1238 can be formed of tungsten oxide. In some embodiments, etch stop layer 806 can be formed using any suitable metal silicide material and oxide material 1238 can be formed of an oxygen-rich metal silicide material. In some embodiments, etch stop layer 806 can be formed of silicon nitride material and oxide material 1238 can be formed of silicon oxynitride. In some embodiments, the oxidization process can be an anneal process in an oxygen environment. In some embodiments, the anneal process can be performed at a nominal elevated temperature, such as between about 300° C. and about 900° C. For example, the anneal process can be performed between about 450° C. and about 550° C.

Referring to FIG. 11, at operation S1190, word line contacts and channel contacts are formed, according to some embodiments. Referring to FIG. 13, word line contacts 1302 and channel contacts 1312 are respectively formed in staircase region 302 and channel 306. Word line contacts 1302 and channel contacts 1312 provide electrical connections to word lines 643 and channels 306. Word line contacts 1302 can include liner layer 1306, and conductive material 1308. In some embodiments, openings 1202 extends into second conductive layer 636 of word line 643, and liner layer 1306 is in contact with dielectric layer 634, first conductive layer 635, and second conductive layer 636, as shown in enlarged view 1350 of FIG. 13. In some embodiments, liner layer 1306 can be uniformly disposed on sidewalls of insulating layer 541 and a top surface of exposed second conductive layer 636, as shown in enlarged view 1350. Similar to liner layer 1006 in FIG. 10, an anisotropic etching process can remove portions of liner layer 1306 from the top surface of exposed second conductive layer 636 such that subsequently disposed conductive material 1308 can be in contact with second conductive layer 636. In some embodiments, liner layer 1306 can be formed using titanium nitride. In some embodiments, liner layer 1306 can be formed during the oxidization process for forming oxide material 1238 by oxidizing a portion of insulating layer 541. Conductive material 1308 is disposed in contact with liner layer 1306. In some embodiments, conductive material 1308 can be similar to conductive material 1008 and is not described in detail herein for simplicity. Liner layer 1306, and conductive material 1308 can be disposed using suitable deposition methods, such as ALD, CVD, PECVD, PVD, or combinations thereof.

Channel contacts 1312 can include liner layer 1316 and conductive material 1318. Each channel contact 1312 can extend through insulating layer 541 and be in contact with a top portion of channel 306. In some embodiments, channel contacts 1312 is in physical and electrical contact with a capping layer 1020 of channel 306.

Figure 15:
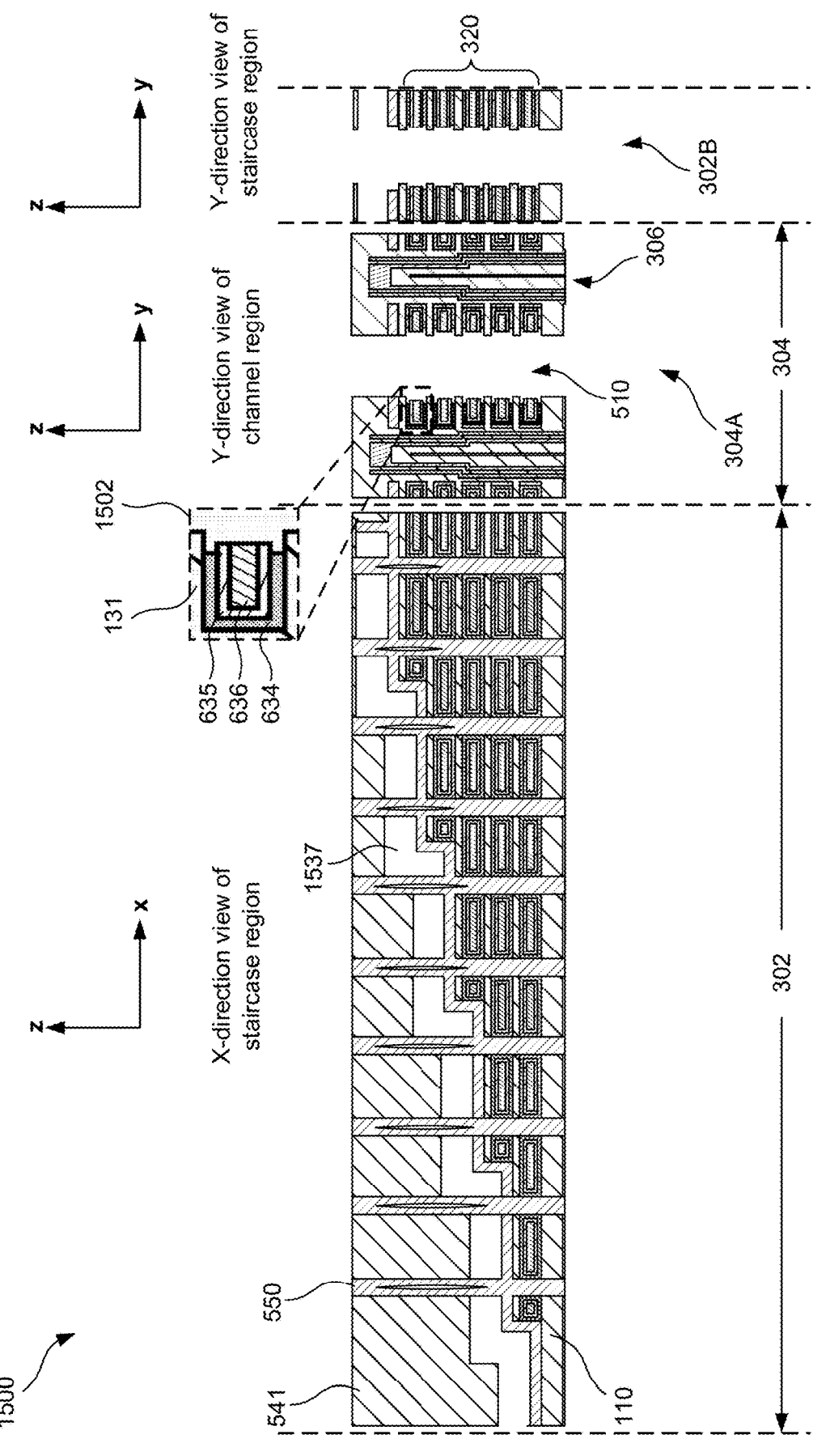
FIGS. 15-17 illustrate schematic cross-sectional views of various fabrication stages of a 3D memory device, according to some embodiments of the present disclosure.
Figure 16:
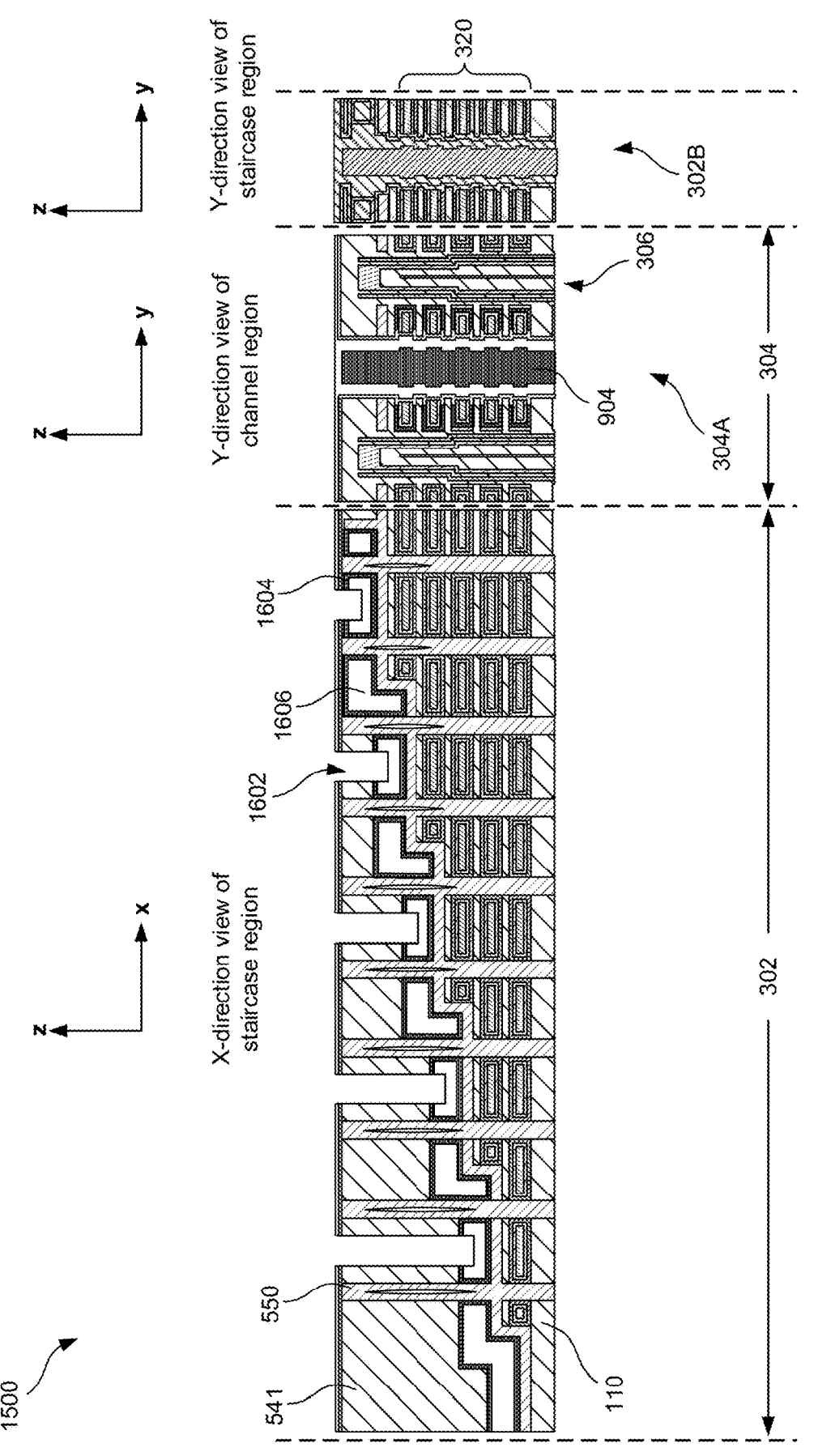
Figure 17:
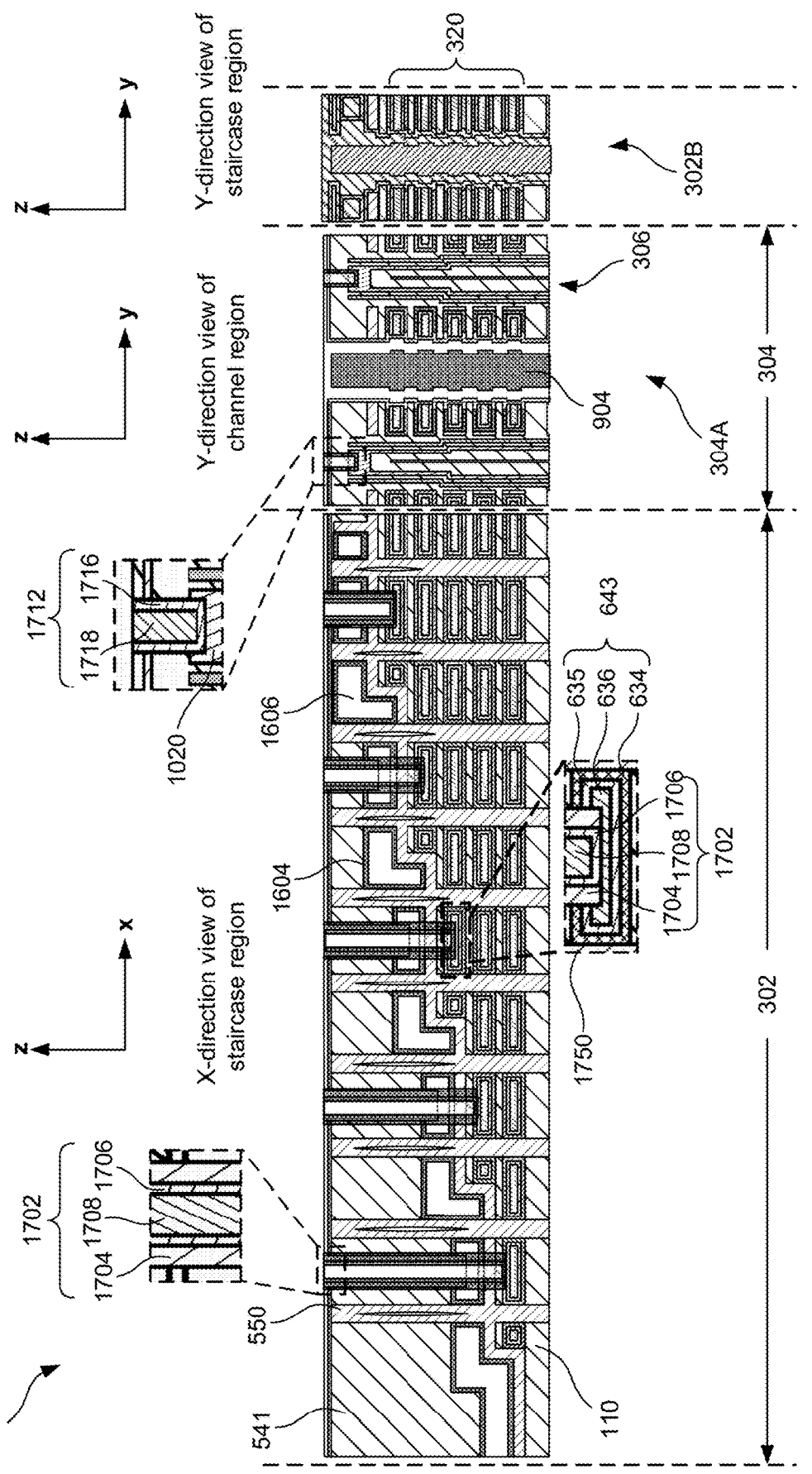

FIG. 14 is a flow diagram of an exemplary method S1400 for forming word line contact structures in 3D memory devices, in accordance with some embodiments of the present disclosure. The operations of method S1400 can be performed in a different order and/or vary, and method S1400 can include more operations that are not described for simplicity. FIGS. 15-17 are cross-sectional views of semiconductor structure 1500 during various fabrication steps for forming word line contact structures. In some embodiments, semiconductor structure 1500 can be a portion of a 3D NAND memory device. The fabrication processes provided here are exemplary, and alternative processes in accordance with this disclosure can be performed that are not shown in these figures. In some embodiments, operations S1410-S1450 and S1470-S1490 can be respectively similar to operations S1110-S1150, S1160, S1170, and S1190 of operation S1100, and are not described in detail herein for simplicity. Elements illustrated in FIGS. 15-17 that have similar reference numbers as elements illustrated in FIGS. 3-10, 12, and 13 generally indicate identical, functionally similar, and/or structurally similar elements.

Referring to FIG. 14, at operation S1460, portions of the gate dielectric layer of the control gate materials are removed, according to some embodiments. Similar to semiconductor structure illustrated in FIG. 7, first and second conductive layers 635 and 636 are etched back during operation S1460 to form control gates between adjacent dielectric layers 131. Referring to FIG. 15, portions of dielectric layer 634 can also be etched back and recessed between dielectric layer 131 and first conductive layer 636, as shown in enlarged view 1502. Portions of dielectric layer 634 can also be removed from cavity 737 of FIG. 7 to form cavity 1537 illustrated in FIG. 15. Similar to cavity 737 of FIG. 7, cavity 1537 can be a continuous cavity extending from a top-most step to a bottom-most step of alternating layer stack 320. In some embodiments, cavity 1537 can extend between other suitable steps of alternating layer stack 320. In some embodiments, portions of dielectric layer 634 can be removed using suitable etching processes. For example, wet chemical etching processes and dry plasma etching processes can be used to remove portions of dielectric layer 634. Removing portions of dielectric layer 634 from sidewalls in openings 510 can provide the benefit of, among other things, reduction of stress in semiconductor structure 1500 which in turn improves device yield and mechanical strength.

Referring to FIG. 14, operation S1470 can include disposing an etch stop layer in cavity 1537 and between adjacent dielectric layers, according to some embodiments. Also referring to FIG. 14, operation S1480 can include forming openings through insulating layer 541 and exposing the disposed etch stop layer, according to some embodiments. As shown in FIG. 16, liner layer 1604 and etch stop layer 1606 can be disposed in cavity 1537, and openings 1602 can be formed extending through insulating layer 541 and exposing portions of etch stop layer 1606. In some embodiments, liner layer 1604 and etch stop layer 1606 can be similar to liner layer 804 and etch stop layer 806 described in FIG. 8. In some embodiments, openings 1602 that exposes portions of etch stop layer 1606 can be similar to openings 902 described in FIG. 9 and formed using similar etching processes. In some embodiments, slit filling structure 904 can be formed in openings 510 and extend through staircase region 302 and channel region 304. In some embodiments, operations S1470 and S1480 can be respectively similar to operations S1160 and S1170 of FIG. 11 and operations S260 and S270 of FIG. 2. Additional details are not described herein for simplicity.

Referring to FIG. 14, at operation S1490, word line contacts and channel contacts are formed, according to some embodiments. Referring to FIG. 17, word line contacts 1702 and channel contacts 1712 are respectively formed in staircase region 302 and channel 306. Word line contacts 1702 and channel contacts 1712 provide electrical connections to word lines 643 and channels 306.

Word line contacts 1702 can include spacers 1704, liner layer 1706, and conductive material 1708. In some embodiments, spacers 1704 can be formed by uniformly disposing a dielectric material on sidewall surfaces and bottom surfaces of openings 1602 of FIG. 16, followed by an anisotropic etching process substantially removing dielectric material in the vertical direction (e.g., z direction), such that the dielectric material remains on the sidewalls of openings 1602. The remaining dielectric material forms spacers 1704. In some embodiments, spacers 1704 can be formed using similar materials and fabrication processes as those of spacers 1004 illustrated in FIG. 10. In some embodiments, spacers 1704 are in contact with dielectric layer 634, first conductive layer 635, and second conductive layer 636, as shown in enlarged view 1750 of FIG. 17. Liner layer 1706 can be disposed after spacers 1704 are formed. In some embodiments, liner layer 1706 can be uniformly disposed on sidewalls of spacers 1704 and a top surface of exposed second conductive layer 636, as shown in enlarged view 1750. In some embodiments, although not illustrated in FIG. 17, an anisotropic etching process can remove portions of liner layer 1706 from the top surface of exposed second conductive layer 636 such that subsequently disposed conductive material 1708 can be in contact with second conductive layer 636. In some embodiments, liner layer 1706 is optional and can be formed using similar fabrication processes as liner layer 1006 of FIG. 10. Conductive material 1708 is disposed between spacers 1704 and in contact with liner layer 1806. In some embodiments, conductive material 1708 can be formed of similar material as conductive material 1008. Spacers 1704, liner layer 1706, and conductive material 1708 can be disposed using suitable deposition methods, such as ALD, CVD, PECVD, PVD, or combinations thereof.

Channel contacts 1712 can include liner layer 1716 and conductive material 1718. Each channel contact 1712 can extend through insulating layer 541 and in contact with a top portion of channel 306. In some embodiments, channel contacts 1712 is in physical and electrical contact with a capping layer 1020 of channel 306.

Figure 19:
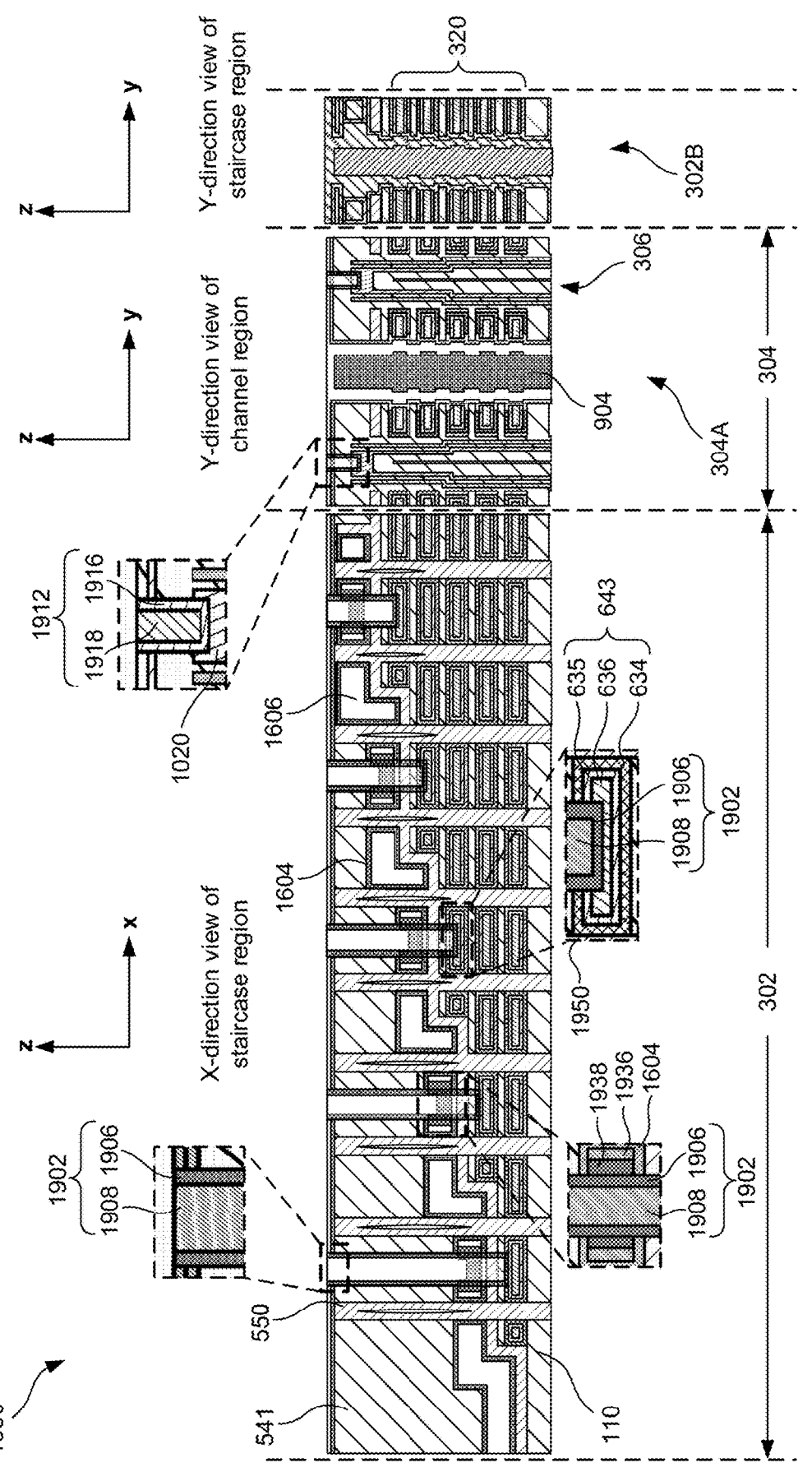
FIG. 19 illustrates a schematic cross-sectional view of a 3D memory device, according to some embodiments of the present disclosure.

FIG. 18 is a flow diagram of an exemplary method S1900 for forming word line contact structures in 3D memory devices, in accordance with some embodiments of the present disclosure. The operations of method S1800 can be performed in a different order and/or vary, and method S1800 can include more operations that are not described for simplicity. FIG. 19 is a cross-sectional view of semiconductor structure 1900 incorporating word line contact structures extending through an oxidized etch stop layer. In some embodiments, semiconductor structure 1900 can be a portion of a 3D NAND memory device. The fabrication processes provided here are exemplary, and alternative processes in accordance with this disclosure can be performed that are not shown in these figures. In some embodiments, operations S1810-S1880 can be respectively similar to operations S1410-S1480 of operation S1400, and are not described in detail herein for simplicity. For example, similar to semiconductor structure 1500, semiconductor structure 1900 also includes a gate dielectric layer being etched back. Elements illustrated in FIG. 19 that have similar reference numbers as elements illustrated in FIGS. 3-10, 12, 13, and 15-17 generally indicate identical, functionally similar, and/or structurally similar elements.

Referring to FIG. 18, at operations S1890 and S1900, an oxidization process is performed on the etch stop layer and word line contacts and channel contacts are formed, according to some embodiments. As shown in FIG. 19, an oxidization process can convert portions of the etch stop layer into an oxide material. For example, portions of etch stop layer 1606 of FIG. 16 can be oxidized to form oxide material 1938. In some embodiments, the oxidization process converts a portion rather than the entirety of etch stop layer 1606. A remaining portion of etch stop layer 1606, such as remaining etch stop layer 1936, is formed between oxide material 1938 and liner layer 1604. In some embodiments, remaining etch stop layer 1936 and oxide material 1938 can be similar to remaining etch stop layer 1236 and oxide material 1238 of FIG. 12, and are not described in detail herein for simplicity.

Word line contacts 1902 and channel contacts 1912 are respectively formed in staircase region 302 and channel 306. Word line contacts 1902 and channel contacts 1912 provide electrical connections to word lines 643 and channels 306. Word line contacts 1902 can include liner layer 1906, and conductive material 1908. In some embodiments, liner layer 1906 can be uniformly disposed on sidewalls of insulating layer 541 and a top surface of exposed second conductive layer 636. Liner layer 1906 and conductive material 1908 can be disposed using suitable deposition methods, such as ALD, CVD, PECVD, PVD, or combinations thereof. Channel contacts 1912 can include liner layer 1916 and conductive material 1918. Each channel contact 1912 can extend through insulating layer 541 and in contact with a top portion of channel 306. In some embodiments, channel contacts 1912 is in physical and electrical contact with a capping layer 1020 of channel 306. Word line contacts 1902 and channel contacts 1912 can be similar to word line contacts 1302 and channel contacts 1312, respectively, and are not described in detail herein for simplicity.

Figures 20, 21, 22:
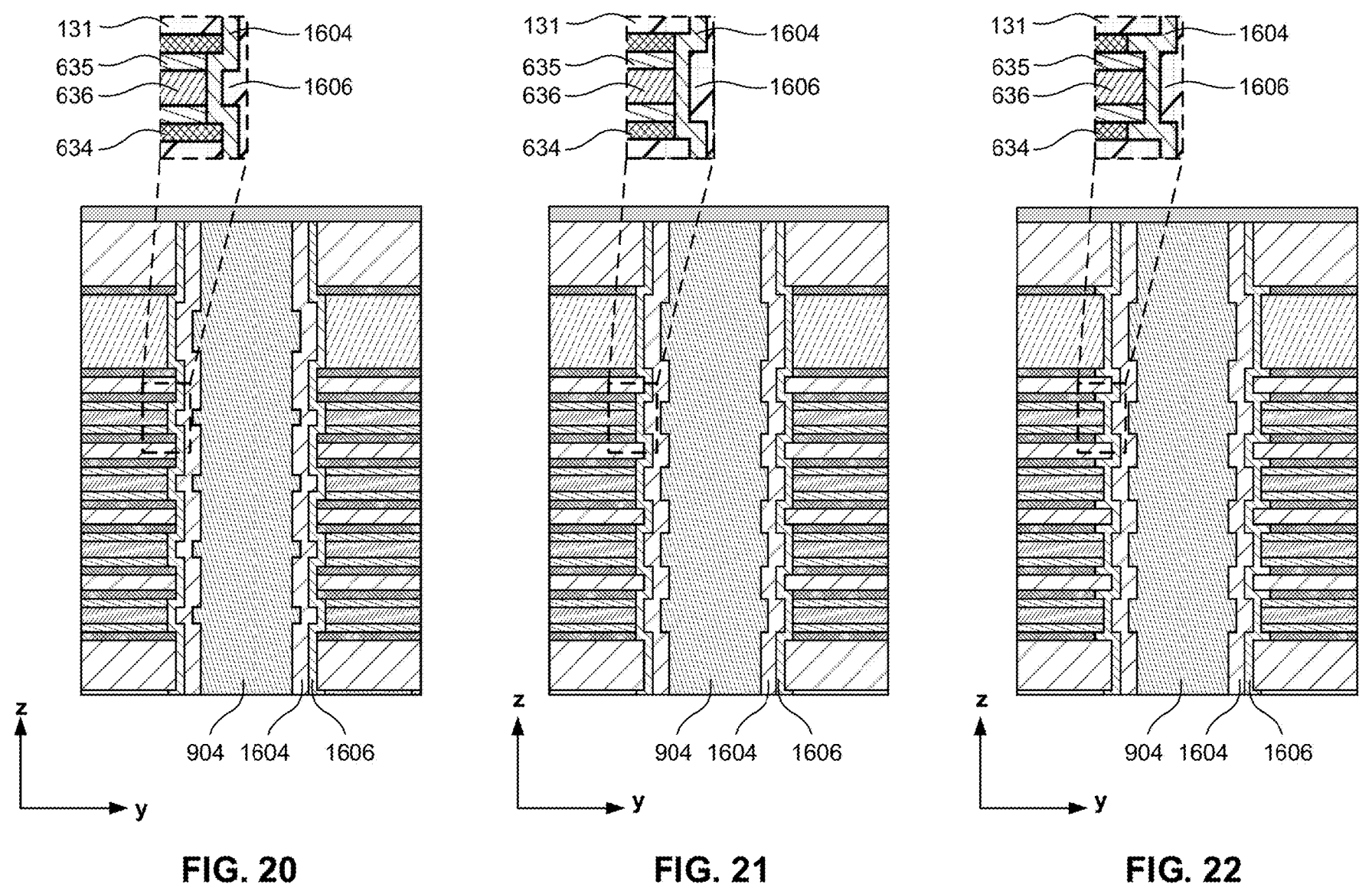

FIGS. 20-22 are cross-sectional views of semiconductor structures having recessed gate dielectric layers and slits formed between the recessed gate dielectric layers. The semiconductor conductor structures illustrated in FIGS. 20-22 can be variations of semiconductor structure 1500 illustrated in FIG. 17 and semiconductor structure 1900 illustrated in FIG. 19. FIGS. 20-22 illustrate gate dielectric layers having different amounts of lateral recess. For example, FIG. 20 illustrates dielectric layer 634 having a sidewall substantially coplanar with dielectric layer 131. FIG. 21 illustrates dielectric layer 634 having a sidewall substantially coplanar with first conductive layer 635. In some embodiments, sidewalls of dielectric layer 634 can be recessed to a position between the sidewalls of dielectric layer 634 illustrated in FIGS. 20 and 21. FIG. 22 illustrates dielectric layer laterally recessed between first conductive layer 635 and dielectric layer 131, and subsequently disposed liner layer 1604 is formed in contact with lateral surfaces of both dielectric layer 131 and first conductive layer 635. Gate dielectric layers having different amounts of lateral recess can be achieved by using different processing conditions and parameters. For example, increasing the etching time of the etching process for etching dielectric layer 634 can lead to dielectric layer 634 being further recessed, such as dielectric layer 634 illustrated in FIG. 22.

Figure 25:
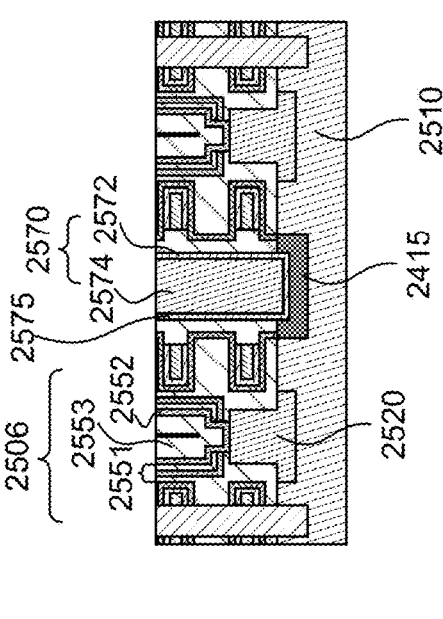
FIGS. 23-25 illustrate schematic cross-sectional views of portions of various 3D memory devices, according to some embodiments of the present disclosure.
Figure 24:
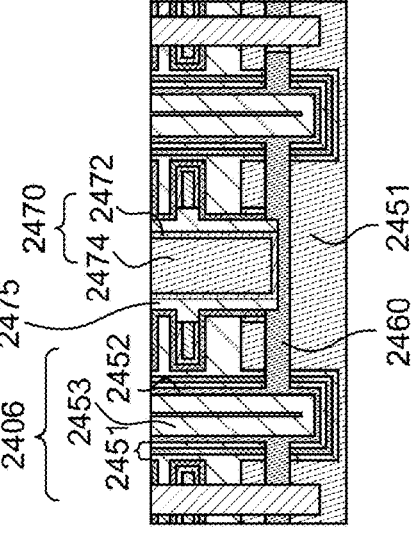
Figure 23:
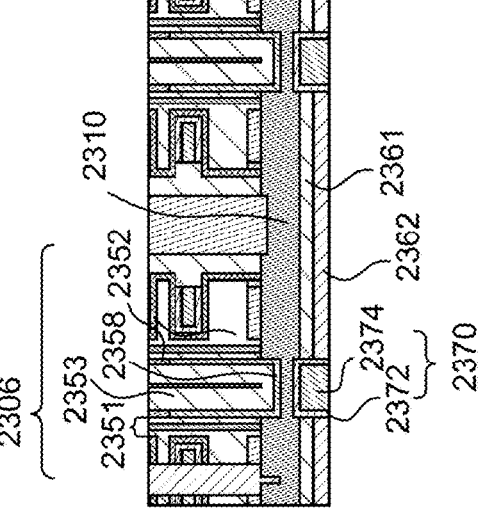

FIGS. 23-25 are cross-sectional views of semiconductor structures having various channel structures and bottom channel contacts.

FIG. 23 is a cross-sectional view of a semiconductor structure having a bottom channel connection. As shown in FIG. 23, channel structure 2306 can include functional layer 2351, channel layer 2352/2358, and channel filling structure 2353. Channel layer can include an upper portion 2352 and a lower portion 2358. Lower portion channel layer 2358 can extend into and be contact with semiconductor layer 2310 (e.g., a polysilicon layer). Channel filling structure 2353 can be surrounded by channel layer 2352 and 2358. First dielectric sublayer 2361 and second dielectric sublayer 2362 can be disposed on a lower side of semiconductor layer 2310. Backside channel source contact structure 2370 can include source contact liner layer 2372 and source contact conductive layer 2374 that penetrate first dielectric sublayer 2361 and second dielectric sublayer 2362.

FIG. 24 is a cross-sectional view of a semiconductor structure having a side channel structure connection. As shown in FIG. 24, channel structure 2406 can include functional layer 2451, channel layer 2452, and channel filling structure 2453. Semiconductor layer 2460 (e.g., a polysilicon layer) is disposed on functional layer 2451 and can laterally penetrate a lower portion of functional layer 2451 and be in contact with channel layer 2452. Slit filing structure 2470 can be sandwiched between insulating layers 2475, and can include liner layer 2472 and conductive layer 2474. Slit filing structure 2470 can be used as the array common source contact being in electrical connection with channel layer 2452 through semiconductor layer 2460.

FIG. 25 is a cross-sectional view of a semiconductor structure having a pillow channel structure connection. As shown in FIG. 25, channel structure 2506 can include functional layer 2551, channel layer 2552, and channel filling structure 2553. A pillow semiconductor structure 2520 (e.g., a polysilicon layer) can be formed on substrate 2510, and can be in contact with the bottom of channel layer 2552. Slit filing structure 2570 can be sandwiched between insulating layers 2575, and can include liner layer 2542 and conductive layer 2574. A bottom of slit filing structure 2570 can be in contact with a doped region 2515 of substrate 2510. Slit filing structure 2570 can be used as the array common source contact being in electrical connection with channel layer 2552 through pillow semiconductor structure 2520.

Various embodiments in accordance with the present disclosure provide structures and fabricating methods for forming word line contacts and control gate structures in 3D memory devices. A continuous dielectric layer is disposed on the steps of a staircase structure. In some embodiments, the continuous dielectric layer continuously extends from upper levels to the lower levels of the staircase structure. An insulating layer is disposed on the staircase structure and on the continuous dielectric layer. The continuous dielectric layer can be removed to form a cavity continuously covering multiple steps of the staircase structure. Conductive materials, such as highly doped polysilicon and metal, can be subsequently disposed in the cavity. In some embodiments, a high-k dielectric layer can be removed from the cavity to reduce stress and wafer bow. In some embodiments, an oxidation process can be performed on the conductive materials to provide electrical isolation between adjacent contacts.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
  forming a staircase structure by etching an alternating layer stack;
  disposing a continuous layer on the staircase structure;
  disposing an insulating layer on the continuous layer;
  removing the continuous layer to form a cavity in place of the continuous layer;
  disposing an etch stop layer in the cavity, wherein the etch stop layer continuously extends over the staircase structure;
  forming a plurality of openings through the insulating layer and the etch stop layer, wherein each of the plurality of openings exposes a corresponding step of the staircase structure; and
  forming a plurality of contacts in the plurality of openings.

2. The method of claim 1, further comprising disposing the alternating layer stack by disposing first dielectric layers and second dielectric layers in an alternating manner.

3. The method of claim 2, further comprising:
  when removing the continuous layer, simultaneously removing the second dielectric layers to form a plurality of additional cavities; and disposing a gate dielectric layer and one or more conductive layers in the plurality of additional cavities.

4. The method of claim 1, wherein forming the plurality of openings comprises:

forming the plurality of openings through the insulating layer, wherein each of the plurality of openings exposes a portion of the etch stop layer; and extending the plurality of openings through the etch stop layer.

5. The method of claim 1, further comprising:

disposing a gate dielectric layer and one or more conductive layers in the cavity; and removing the one or more conductive layers from the cavity.

6. The method of claim 1, further comprising oxidizing the etch stop layer through the plurality of openings.

7. The method of claim 1, wherein disposing the etch stop layer comprises disposing a metal silicide material or a silicon nitride material.

8. The method of claim 1, wherein exposing the corresponding step of the staircase structure comprises exposing a lateral surface of the each step of a plurality of steps of the staircase structure by etching through a gate dielectric layer and exposing an underlying conductive material.

9. The method of claim 1, further comprising:

after disposing the insulating layer and before removing the continuous layer, forming a plurality of dummy channels through the insulating layer, the continuous layer, and the staircase structure.

10. The method of claim 1, further comprising:

before disposing the continuous layer, forming a liner layer on the staircase structure.

11. A method for forming a three-dimensional (3D) memory device, comprising:

disposing an alternating layer stack on a substrate, comprising disposing a plurality of first dielectric layers and a plurality of second dielectric layers in an alternating manner;

etching the alternating layer stack to form a staircase structure;

disposing a third dielectric layer on the staircase structure;

disposing an insulating layer on the third dielectric layer;

removing, the plurality of second dielectric layers to form a plurality of cavities, and the third dielectric layer to form an additional cavity;

disposing a gate dielectric layer and one or more conductive layers in each cavity of the plurality of cavities and in the additional cavity;

removing the one or more conductive layers from the additional cavity and disposing an etch stop layer in the additional cavity;

forming a plurality of openings through the insulating layer, wherein each opening of the plurality of openings terminates at the etch stop layer;

etching the etch stop layer through the plurality of openings to expose portions of the one or more conductive layers disposed in the each cavity of the plurality of cavities; and forming a plurality of contacts on the exposed portions of the one or more conductive layers.

12. The method of claim 11, wherein:

the staircase structure comprises a plurality of steps;

each step of the plurality of steps comprises a sidewall surface and a lateral surface; and the third dielectric layer continuously contacts sidewall surfaces and lateral surfaces of the plurality of steps.

13. The method of claim 11, further comprising oxidizing a portion of the etch stop layer through the plurality of openings.

14. The method of claim 11, further comprising forming a slit extending through the staircase structure, wherein the slit exposes sidewalls of the plurality of first dielectric layers, sidewalls of the plurality of second dielectric layers, and a sidewall of the third dielectric layer.

15. The method of claim 14, wherein:

removing the plurality of second dielectric layers and the third dielectric layer comprises etching the plurality of second dielectric layers and the third dielectric layer through the slit.

* * * * *